(12) United States Patent
Fukuzumi et al.

(10) Patent No.: US 8,350,314 B2
(45) Date of Patent: Jan. 8, 2013

(54) SEMICONDUCTOR MEMORY DEVICE AND METHOD FOR FABRICATING SEMICONDUCTOR MEMORY DEVICE

(75) Inventors: Yoshiaki Fukuzumi, Kanagawa-ken (JP); Ryota Katsumata, Kanagawa-ken (JP); Masaru Kidoh, Tokyo (JP); Masaru Kito, Kanagawa-ken (JP); Hiroyasu Tanaka, Tokyo (JP); Hideaki Aochi, Kanagawa-ken (JP); Yasuyuki Matsuoka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 596 days.

(21) Appl. No.: 12/325,711

(22) Filed: Dec. 1, 2008

(65) Prior Publication Data

US 2009/0146190 A1    Jun. 11, 2009

(30) Foreign Application Priority Data

Nov. 30, 2007  (JP) ................. 2007-311340

(51) Int. Cl.
*H01L 29/792* (2006.01)
(52) U.S. Cl. ............ 257/324; 257/315; 257/E21.192; 257/E21.679
(58) Field of Classification Search ............ 438/52; 257/315, E21.192, E21.679, 324
See application file for complete search history.

(56) References Cited

U.S. PATENT DOCUMENTS

| 5,599,724 | A | 2/1997 | Yoshida |
| 5,707,885 | A | 1/1998 | Lim |
| 7,847,334 | B2 | 12/2010 | Katsumata et al. |
| 2004/0175856 | A1* | 9/2004 | Jaiprakash et al. ............ 438/52 |
| 2007/0158736 | A1* | 7/2007 | Arai et al. ..................... 257/315 |
| 2007/0252201 | A1 | 11/2007 | Kito et al. |

FOREIGN PATENT DOCUMENTS

JP    2003-78044    3/2003

OTHER PUBLICATIONS

U.S. Appl. No. 12/260,589, filed Oct. 29, 2008, Masaru Kito, et al.

* cited by examiner

*Primary Examiner* — Jerome Jackson, Jr.
*Assistant Examiner* — Dale E Page
(74) *Attorney, Agent, or Firm* — Oblon, Spivak, McClelland, Maier & Neustadt, L.L.P.

(57) ABSTRACT

According to an aspect of the present invention, there is provided a nonvolatile semiconductor memory device, comprising a plurality of memory strings, each of the memory strings being constituted with a plurality of electrically erasable memory cells being serially connected each other, the memory strings comprising:

a columnar semiconductor layer perpendicularly extending toward a substrate;

a plurality of conductive layers being formed in parallel to the substrate and including a first space between a sidewall of the columnar semiconductor layers; and characteristic change layer being formed on the sidewall of the columnar semiconductor layer faced to the first space or a sidewall of the conductive layer faced to the first space and changing characteristics accompanying with applied voltage;

wherein the plurality of the conductive layers have a function of a relative movement to a prescribed direction for the columnar semiconductor layer.

20 Claims, 38 Drawing Sheets

SEMICONDUCTOR MEMORY DEVICE AND METHOD FOR FABRICATING SEMICONDUCTOR MEMORY DEVICE

CROSS REFERENCE TO RELATED APPLICATION

This application is based upon and claims the benefit of priority from the prior Japanese Application (No. 2007-311340, filed Nov. 30, 2007), the entire contents of which are incorporated herein by reference.

FIELD OF THE INVENTION

The present invention relates to an electrically erasable semiconductor memory device and a method for fabricating the electrically erasable semiconductor memory device, and in particular, to a nonvolatile semiconductor memory device and the method for fabricating the nonvolatile semiconductor memory device.

DESCRIPTION OF THE BACKGROUND

Conventionally, electrical elements have been integrated in a two-dimensional plane of a semiconductor substrate or a semiconductor-on-insulator substrate to form an LSI. A dimension of the element has been miniaturized for increasing a memory capacity in a semiconductor memory device, however, the miniaturization has become increasingly difficult from view point of cost and technology. Therefore, an improvement of photolithography technology is desirable. However, it is anticipated that physical properties such as a breakdown voltage or the like reach to limitation without scaling driving voltage or the like level when the miniaturization is accomplished.

Recently, various approaches have been studied for highly integrating the semiconductor memory device. For example, employing a multiple-value technique, three-dimensionally stacking memory cells disclosed in Japanese Patent Publication (Kokai) No. 2003-078044, U.S. Pat. No. 5,599,724, U.S. Pat. No. 5,707,885, for example, using MEMS (Micro Electro Mechanical Systems) has been studied. However, it is necessary to overcome many problems for realization the approaches mentioned above. For example, in the case of three-dimensionally stacking memory cells, processing steps in a conventional method are largely increased layer by layer to increase the cost. Further, in a seek-scan type memory device using MEMS, an area of memory storage for retaining data on one bit is fixed by thermal stability or the like so as to limit the memory density.

SUMMARY OF INVENTION

According to an aspect of the invention, there is provided a nonvolatile semiconductor memory device, comprising a plurality of memory strings, each of the memory strings being constituted with a plurality of electrically erasable memory cells being serially connected each other, the memory strings comprising:

a columnar semiconductor layer perpendicularly extending for a substrate;

a plurality of conductive layers being formed in parallel with the substrate and including a first space between sidewalls of the columnar semiconductor layers; and a characteristic change layer being formed on the sidewall of the columnar semiconductor layer faced to the first space or a sidewall of the conductive layer faced to the first space, the characteristic change layer changing characteristics accompanying with applied voltage;

wherein each of the conductive layers has a function as a relative movement to a prescribed direction for the columnar semiconductor layer.

Further, another aspect of the invention, there is provided a method for fabricating a nonvolatile semiconductor memory device, the nonvolatile semiconductor memory device comprising a plurality of memory strings, each of the memory strings being constituted with a plurality of electrically erasable memory cells being serially connected each other, comprising:

forming a source-side transistor layer on a semiconductor substrate;

depositing a silicon-nitride film, a silicon-oxide film, a germanium-silicon film, a silicon-oxide film and a silicon film to form an isolation insulator, a first protective layer, a first sacrifice layer, a second protective layer and a third frame bottom layer on the source-side transistor layer;

forming a first hole at a portion aligned with the source-side columnar semiconductor layer to pass through the third frame bottom layer, the second protective layer, the first sacrifice layer, the first protective layer and the isolation insulator;

forming a second sacrifice layer and a first columnar semiconductor layer on a sidewall of the first hole;

alternately forming a plurality of conductive layers and a plurality of first interlayer insulators on the first columnar semiconductor layer, the second sacrifice layer and the third frame bottom layer;

forming a second hole at a portion aligned with the first hole to pass through the plurality of the conductive layers and the plurality of the first interlayer insulators, constituting a memory hole with the first hole and the second hole;

forming the block insulation layer, the charge storage layer, the tunnel insulation layer, the third sacrifice layer and the second columnar semiconductor layer on a sidewall of the second hole in order, constituting a columnar semiconductor layer with the first columnar semiconductor layer and the second columnar semiconductor layer;

etching the first protective layer, the first sacrifice layer, the third frame bottom layer, the plurality of the conductive layers and the plurality of the first interlayer insulators to form into a shape of stairs;

forming a second interlayer insulator onto an upper surface of the columnar semiconductor layer;

forming a first groove onto au upper surface of the isolation insulator to pass through the interlayer insulator;

forming a second groove, a third groove and a fourth groove onto the first sacrifice layer to pass through the interlayer insulator to form a fourth sacrifice layer, a second frame layer and a fifth sacrifice layer in the second groove, the third groove, the fourth groove, respectively;

forming a fifth groove onto the third frame bottom layer to pass through the interlayer insulator to form a third frame in the fifth groove;

forming first-fourth holes by passing through the interlayer insulator onto an upper surface of an end in the row direction the plurality of the conductive layer and forming plug conductive layers in the first-fourth holes;

forming a sixth sacrifice layer on the first frame layer, a drain-side first insulation layer on the sixth sacrifice layer and first drain-side hole at a portion aligned with the memory hole.

forming a seventh sacrifice layer 51g and a drain-side first columnar semiconductor layer on a sidewall of the first drain-side hole;

forming a drain-side first insulation layer, a drain-side conductive layer and a drain-side second insulation layer on the drain-side first insulation layer;

forming a drain-side second hole at s portion aligned with the drain-side first hole to form a drain-side hole constituted with the drain-side first hole and the drain-side second hole;

forming a drain gate insulation layer and a drain-side second columnar semiconductor layer on a sidewall of the drain-side second hole to form a drain-side columnar semiconductor layer constituted with the drain-side first columnar semiconductor layer and the drain-side second columnar semiconductor layer;

forming a bit line layer at a portion aligned with the drain-side hole;

forming a drain-side third hole to a depth of the sixth sacrifice layer; and removing the first-seventh sacrifice layers in the third drain-side hole by vapor atmosphere of $ClF_3$ so as to form a space.

DETAILED DESCRIPTION OF THE INVENTION

Figure 1:
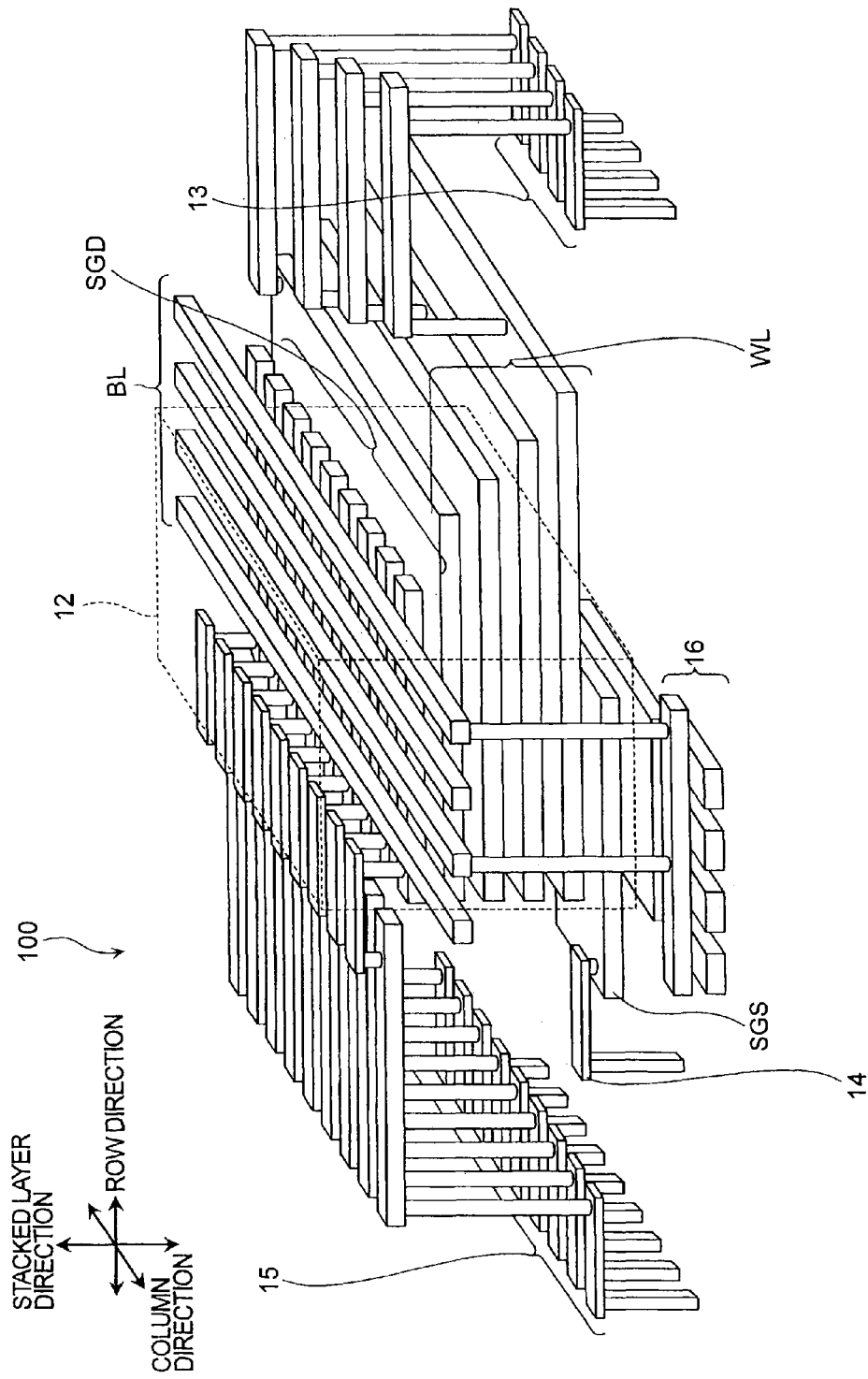
FIG. 1 is a structure diagram showing a nonvolatile semiconductor memory device according to a first embodiment of the present invention.

Embodiments of the present invention will be described below in detail with reference to the drawings mentioned above.

It is to be noted that the same or similar reference numerals are applied to the same or similar parts and elements throughout the drawings, and the description of the same or similar parts and elements will be omitted or simplified.

First Embodiment

First, according to a first embodiment of the present invention, a nonvolatile semiconductor memory device is explained device with reference to the drawings.

(A Structure of the Nonvolatile Semiconductor Memory Device)

FIG. 1 is a structure diagram showing a nonvolatile semiconductor memory device 100 according to a first embodiment of the present invention;

As shown in FIG. 1, the nonvolatile semiconductor memory device 100 according to the first embodiment mainly includes a memory cell region 12, a word line driving circuit 13, a source-side selection gate line (SGS) driving circuit 14, a drain-side selection gate line (SGS) driving circuit 15 and a sense amplifier 16. The memory cell region 12 includes memory cells memorizing data. The word line driving circuit 13 controls voltage applied to a word line WL. The source-side selection gate line (SGS) driving circuit 14 controls voltage applied to the source-side selection gate line SGS. The drain-side selection gate line (SGS) driving circuit 15 controls voltage applied to a drain-side selection gate line (SGD). The sense amplifier 16 amplifies potential read out from the memory cells. Other than mentioned above, the nonvolatile semiconductor memory device 100 according to the first embodiment includes a bit line driving circuit (not illustrated) controlling voltage applied to a bit line BL and a source line driving circuit (not illustrated) controlling voltage applied to a source line SL (not illustrated).

Furthermore, in the nonvolatile semiconductor memory device 100 according to the first embodiment, the memory cells constituting the memory cell region 12 are formed by stacking a plurality of semiconductor layers in order. Further, each layer of the word lines WL is two-dimensionally extended in a prescribed area as shown in FIG. 1. Each layer of the word lines WL has a plane structure of a single layer.

Figure 2:
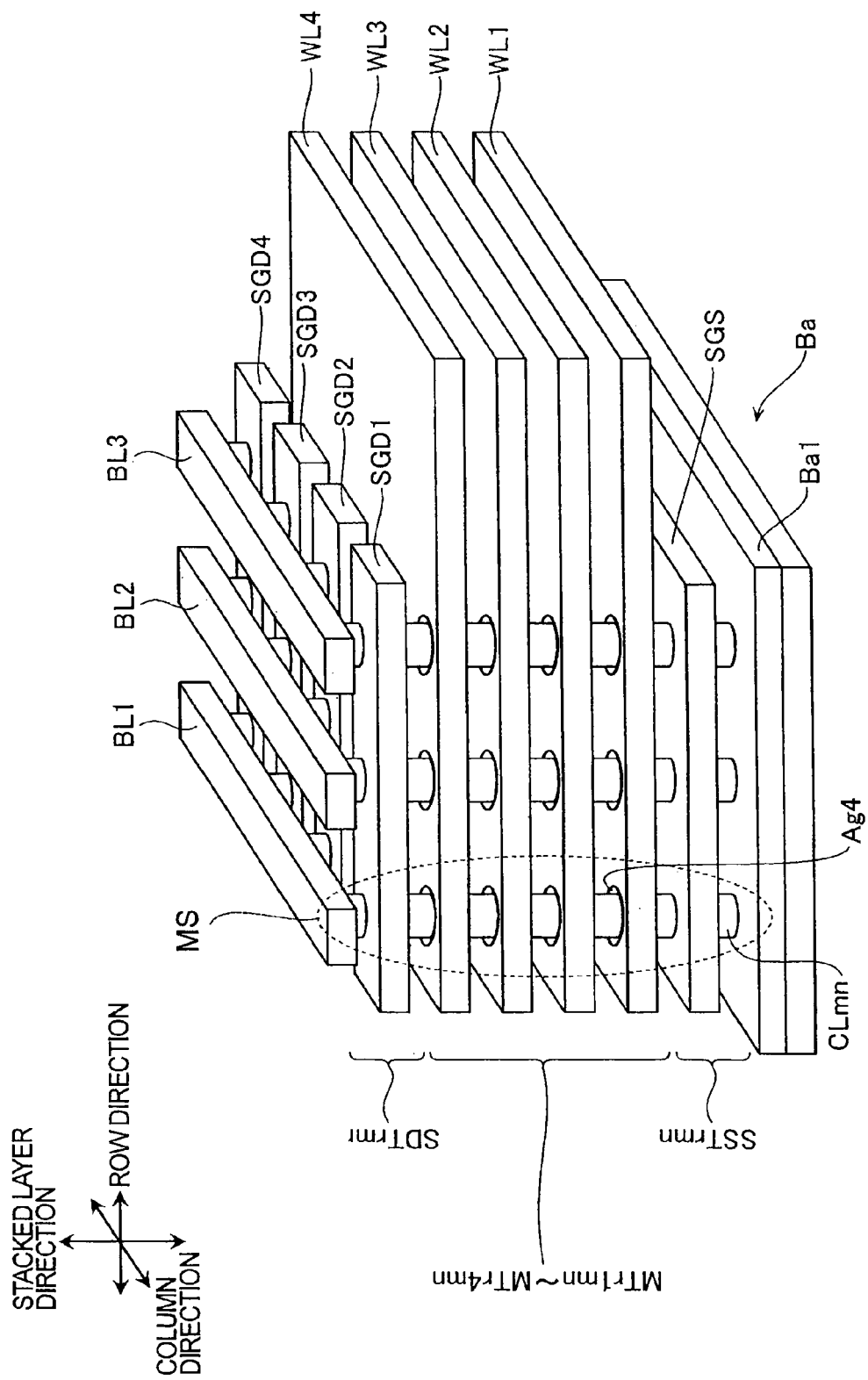
FIG. 2 is a part of a perspective schematic view showing the nonvolatile semiconductor memory device according to the first embodiment of the present invention.

FIG. 2 is a part of a perspective schematic view showing the memory cell region 12 in the nonvolatile semiconductor memory device 100 according to the first embodiment.

In the first embodiment, the memory cell region 12 includes m×n numbers (m and n being counting numbers) of memory strings MS being constituted with memory cells MTr1$mn$-MTr4$mn$, source-side selection transistors SSTrmn and drain-side selection transistor SDTrmn. In FIG. 2, m and n equals to three and four, respectively, as an example.

Each of the word lines WL1-WL4 is connected to each gate of the memory cells MTr1$mn$-MTr4$mn$ in each of the memory strings MS and each of the word lines WL1-WL4 are formed of the same conductive layer and are common in plane each other. The memory cell MTr1$mn$ in each of the memory strings MS has a structure of a transistor and all gates of memory cells MTr1$mn$ are connected to a word line WL1. Further, all gates of memory cells MTr2$mn$ in each of the memory strings MS are connected to a word line WL2. Further, all gates of memory cells MTr3$mn$ in each of the memory strings MS are connected to a word line WL3. Further, all gates of memory cells MTr4$mn$ in each of the memory strings MS are connected to a word line WL4. In the nonvolatile semiconductor memory device 100 according to the first embodiment as shown in FIG. 1 and FIG. 2, each of the word lines WL1-WL4 is two-dimensionally extended in plane and has the plane structure like a board. Further, each of the word line WL1-WL4 is configured nearly perpendicular to the memory strings MS.

Each of the memory strings MS includes columnar semiconductors CLmn on a p-well region Ba1 formed in an n+region of a semiconductor substrate Ba. In FIG. 2, for example, m equals from 1 to 3 and n equals from 1 to 4. Each of the columnar semiconductors CLmn are formed to perpendicular the semiconductor substrate Ba, and the columnar semiconductors CLmn are displaced like a matrix above the semiconductor substrate Ba and the word lines WL1-WL4. Thus, the memory strings MS are also displaced like a matrix in a plane perpendicular to the columnar semiconductors CLmn. An insulation layer (not illustrated) and a space (fourth space) Ag4 are formed between the columnar semiconductors CLmn and the word lines WL1-WL4. Each of the columnar semiconductors CLmn may be a cylinder column or a rectangular column. Further, the columnar semiconductor CLmn includes a columnar semiconductor with a shape of stairs.

Furthermore, as shown in FIG. 2, the source-side selection gate line SGS constituting a source-side selection transistors SSTrmn is configured under the memory strings MS and contacting the columnar semiconductor CLmn and the insulation layer (not illustrated) via the columnar semiconductor CLmn and the insulation layer (not illustrated). The source-side selection gate line SGS is two-dimensionally extended in plane like the word lines WL1-WL4 and has the plane structure like a board. Moreover, the columnar semiconductor layer CLmn is configured through the source-side selection gate line SGS. In the structure mentioned above, the source-side selection gate line SGS with the plane structure like a board, however, the source-side selection gate line SGS may be formed like a line as like a drain-side selection gate line SGD mentioned later.

Furthermore, as shown in FIG. 2, the drain-side selection gate lines SGD constituting the drain-side selection transistor SDTrmn is configured upper the memory strings MS and contacting the columnar semiconductors CLmn and the insulation layer (not illustrated) via the columnar semiconductors CLmn and the insulation layer (not illustrated). In FIG. 2, the drain-side selection gate lines SGD are illustrated as SGD1-SGD4. Each of the drain-side selection gate lines SGD is isolated each other. The drain-side selection gate line SGD is formed as a stripe which has a prescribed pitch to the column direction and extended to the row-direction as different for the word lines WL1-WL4. Furthermore, the columnar semiconductor layers CLmn is configured at a center in the width direction of the drain-side selection gate line SGD formed as the stripe so as to pass through the center. Further, the row-direction means parallel with the semiconductor substrate Ba and orthogonal to the stacked layers. On the other hand, the column direction is orthogonal to the row-direction.

Figure 3:
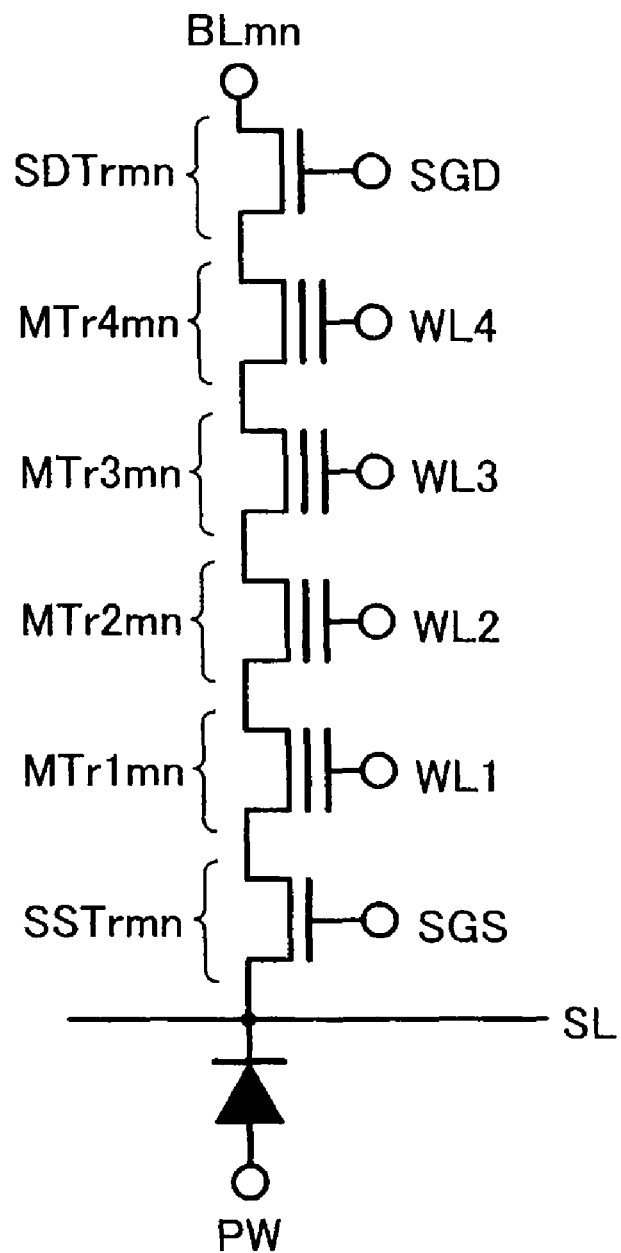
FIG. 3 is a circuit diagram showing a memory string MS of the nonvolatile semiconductor memory device according to the first embodiment of the present invention.

Next, as reference to FIG. 2 and FIG. 3, a circuit configuration and a mechanism of the memory strings MS according to the first embodiment are explained. FIG. 3 is a circuit diagram showing the memory strings MS in the nonvolatile semiconductor memory device according to the first embodiment.

In the first embodiment as shown in FIG. 2 and FIG. 3, the memory string MS includes four memory cells MTr1$mn$-MTr4$mn$, the source-side selection transistors SSTrm and the drain-side selection transistor SDTrmn. These four memory cells MTr1$mn$-MTr4$mn$, the source-side selection transistors SSTrm and the drain-side selection transistor SDTrmn are serially connected each other as shown in FIG. 3.

Figure 4:
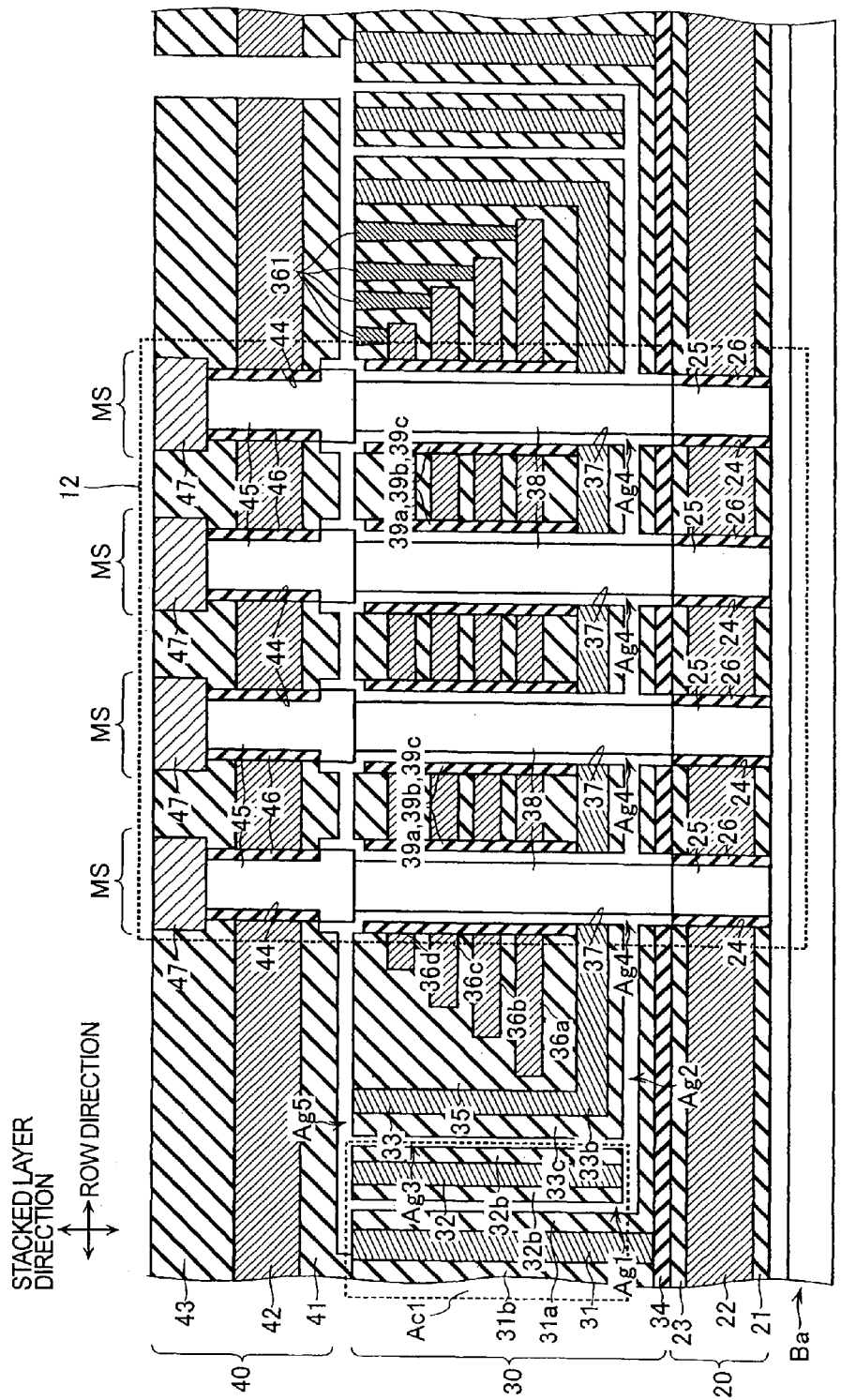
FIG. 4 is a cross-sectional schematic view showing a structure of the nonvolatile memory semiconductor device according to the first embodiment of the present invention.

FIG. 4 is a cross-sectional schematic view showing a structure of the nonvolatile memory semiconductor device according to the first embodiment. As shown in FIG. 4, in the first embodiment of the memory strings MS, the columnar semiconductor CLmn is formed on an n+-region formed in a p-type region (p-Well region) Ba1 of a semiconductor substrate Ba. Thus, source line SL is connected to a source of the source-side selection transistors SSTrmn. The source means the n+-region formed in the p-well region Ba1 of the semiconductor substrate Ba. Further, the bit line BL is connected to a drain of each of the drain-side selection transistor SDTrmn.

Each of the memory cells Mtrmn includes the columnar semiconductor CLmn, the insulation layer surrounding the columnar semiconductor CLmn via the space Ag4 as shown in FIG. 2, a charge storage layer (not illustrated in FIG. 2 and FIG. 3) and the word line WL surrounding the insulation layer and the charge storage layer. An end portion of the word line WL contacting with the charge storage layer surrounded by the insulator act as a control gate of the memory cell Mtrmn. A source and a drain of each of the memory cells MTrmn are formed in each of the columnar semiconductors CLmn.

The source-side selection transistors SSTrmn includes the columnar semiconductor CLmn, the insulation layer surrounding the columnar semiconductor CLmn and the source-side selection gate line SGS surrounding the insulation layer. An end portion of the source-side selection gate line SGS contacting with the insulation layer acts as a control gate of the source-side selection transistors SSTrmn.

The drain-side selection transistors SDTrmn include the columnar semiconductors CLmn, the insulation layer surrounding the columnar semiconductor CLmn and the drain-side selection gate line SGD surrounding the insulation layer. An end portion of the drain-side selection gate line SGD contacting with the insulation layer acts as a control gate of each of the drain-side selection transistors SDTrmn.

The nonvolatile semiconductor memory device 100 being constituted with the above mentioned structure is controlled by the bit lines BL1-BL3, the drain-side selection gate line SGD, the word lines WL1-WL4 and the source-side selection gate line SGS. Voltage of the source line SL is controlled by a bit line driving circuit (not illustrated), the drain-side selection gate line driving circuit 15, the word line driving circuit 13, the source-side selection gate line driving circuit 14, a source line driving circuit (not illustrated) and the bit line driving circuit (not illustrated). Accordingly, reading out data, writing in data and erasing data are performed by controlling electrical charges of the charge storage layer in the prescribed memory cell. Thus, the drain-side selection gate line driving circuit 15, the word line driving circuit 13, the source-side selection gate line driving circuit 14, the source line driving circuit and the bit line driving circuit have a function as control circuits controlling the memory strings MS.

(A Specific Configuration of the Nonvolatile Semiconductor Memory Device)

Figure 5:
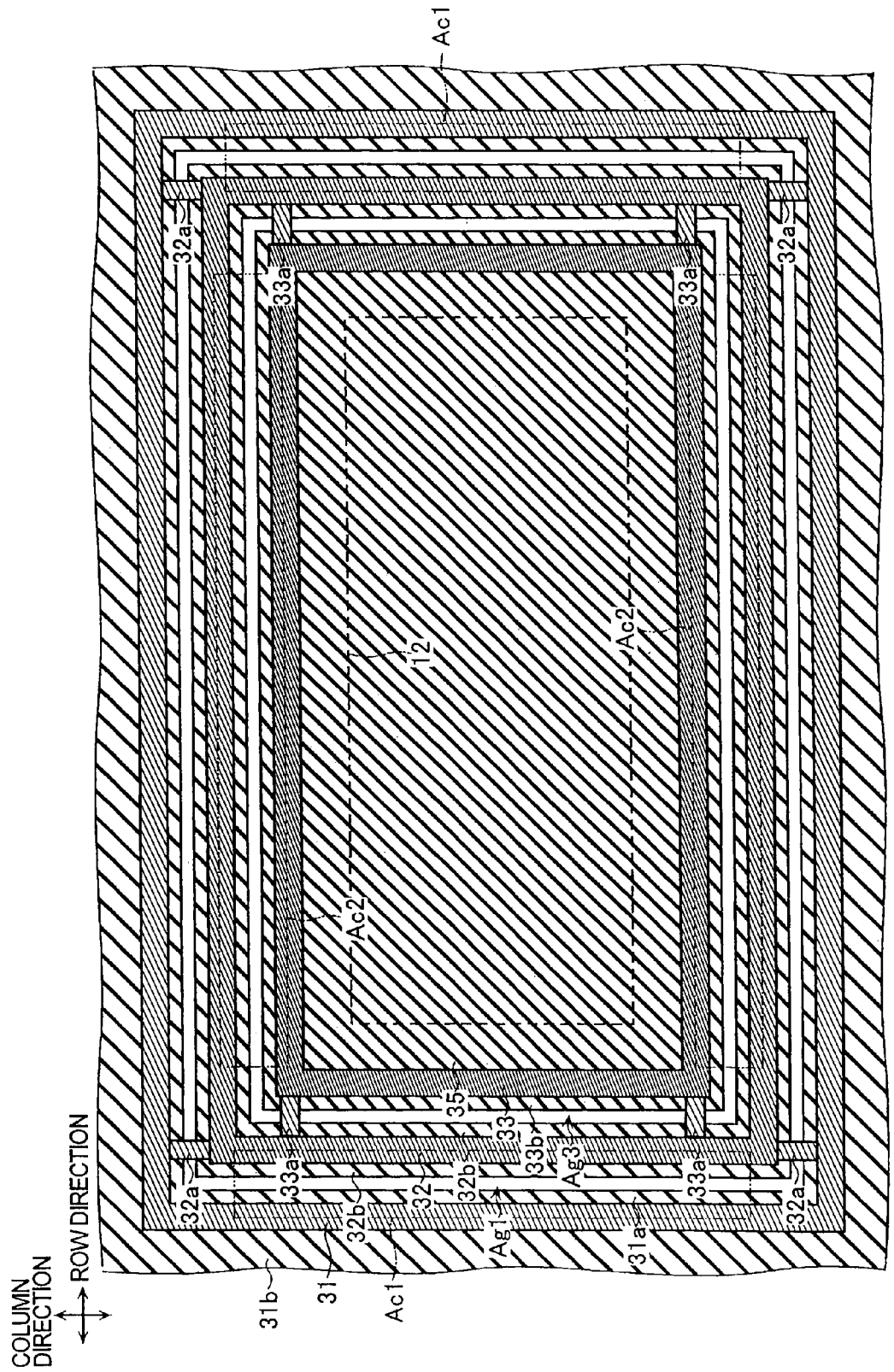
FIG. 5 is a plan view showing a memory layer of the nonvolatile memory semiconductor device according to the first embodiment of the present invention.

Next, as reference to FIG. 4 and FIG. 5, a specific configuration of the nonvolatile semiconductor memory device 100 according to the first embodiment is explained.

As shown in FIG. 4, the nonvolatile semiconductor memory device 100 (the memory cell strings MS) includes a source-side selection transistor layer 20, a memory layer 30 and a drain-side selection transistor layer 40 in order from a lower layer towards an upper layer. The source-side selection transistor layer 20 acts as the source-side selection transistors SSTrmn. The memory layer 30 acts as the memory cells Mtrmn. The drain-side selection transistor layer 40 acts as the drain-side selection transistor SDTrmn.

Furthermore, a first actuator Ac1 and a second actuator Ac1 are configured a periphery portion of the memory cells MS. The first actuator Ac1 and the second actuator Ac1 are closely explained in FIG. 5.

The source-side selection transistor layer 20 includes a first source-side insulation layer 21 formed on the source line layer (acting as the source line SL) of the semiconductor substrate Ba, a source-side conductive layer 22 formed on the first source-side insulation layer 21 and a second source-side insulation layer 23 formed on the source-side conductive layer 22.

Further, the source-side selection transistor layer 20 includes a source-side hole 24 passing through the first source-side insulation layer 21, the source-side conductive layer 22, the second source-side insulation layer 23 and a source-side columnar semiconductor layer 25. A source-side gate insulation layer 26 is formed between a sidewall of the source-side columnar semiconductor layer 25 and the first source-side insulation layer 21, the source-side conductive layer 22 and the second source-side insulation layer 2. The source-side columnar semiconductor layer 25 is formed by an amorphous silicon film. The source-side gate insulation layer 26 is formed of silicon-dioxide.

FIG. 5 is a plan view showing a memory layer of the nonvolatile memory semiconductor device. As shown in FIG. 5, the memory layer 30 includes a first frame layer 31, a second frame layer 32 and a third frame layer 33. The three frames with a rectangular column are formed from the periphery portion towards the memory cell region 12 in order from top view so as to surround the memory cell region 12. The first frame layer 31, the second frame layer 32 and the third frame layer 33 are formed of silicon.

As shown in FIG. 4, the first frame layer 31 is formed on an isolation insulator 34 on the second source-side insulation layer 23. As a result, the first frame layer 31 is fixed with the isolation insulator 34. Further, a first protective layer 31a is formed on a sidewall of the first frame layer 31 and an isolation insulator 34a at a side of the memory cell region 12. Further, a periphery insulation layer 31b is formed on a sidewall of the first frame layer 31 formed opposite to the memory cell region 12 and on the isolation insulator 34 to be successively formed on the first frame layer 31. The first protective layer 31a and periphery insulation layer 31b is formed of silicon-dioxide (SiO$_2$).

As shown in FIG. 5, the second frame layer 32 is connected to the first frame layer 31 via two pairs of first connection layers 32a being formed at both sides of the row direction and being extended to the column direction. As shown in FIG. 4, the second frame layer 32 is configured by the two pairs of the first connection layer 32a via a first space Ag1 formed towards the row direction and the column direction between the first protective layers 31a. Further, the second frame layer 32 is configured from the isolation insulator 34 to stacking direction via a second space Ag2. Namely, the second frame layer 32 is constructed to relatively move to row direction corresponding to the first frame layer 31 and the isolation insulator 34. A second protective layer 32b is formed on a sidewall of the second frame layer 32. A second protective layer 32b is formed of silicon-dioxide.

As shown in FIG. 5, the third frame layer 33 is connected to the second frame layer 32 via two pairs of second connection layers 33a being formed at both sides of the row direction and being extended to the row direction. As shown in FIG. 4, the third frame layer 33 is configured by the two pairs of the second connection layer 33a via a third space Ag3 formed towards the row direction and the column direction between the second frame layers 32. Further, third frame layer 33 is configured from the isolation insulator 34 to stacking direction via the second space Ag2. As shown in FIG. 4, a third frame bottom layer 33b is formed on a bottom of a third frame layer 33 to be extended to an end of the third frame layer 33 in the row direction and the column direction. Namely, the third frame layer 33 is constructed to relatively move to the column direction corresponding to the second frame layer 32. A third protective layer 33c is formed on a sidewall of third frame layer 33 and a lower surface of the third frame bottom layer 33b. The third protective layer 33c is formed of a silicon-dioxide.

An interlayer insulator 35 is formed on a top surface of the third frame bottom layer 33. Further, first-fourth word line conduction layers 36a-36d between the interlayer insulators 35 are formed. The first-fourth word line conduction layers 36a-36d act as the word lines WL1-WL4. The first-fourth word line conduction layers 36a-36d are two-dimensionally extended and an end of the word line conduction layers 36a-36d in the row direction is formed as step by step. A plug conductive layer 361 is formed on an end in the row direction of a top surface of the first-fourth word line conduction layers 36a-36d to be extended onto a top surface of the memory layer 30. A wiring (not illustrated) connected to a top surface of a plug conductive layer 361 is put out to a periphery portion through a first connection layer 32a and a second connection layer 33a. The interlayer insulator 35 is formed of silicon-dioxide. The first-fourth word line conduction layers 36a-36d is formed of poly-crystalline silicon.

As shown in FIG. 5, the first actuator Ac1 is configured between the first frame layer 31 and the second frame layer 3. Further, the second actuator Ac2 is configured between the second frame layer 32 and the third frame layer 33. The first actuator Ac1 forces to displace the second frame layer 32 to the row direction corresponding to the first frame layer 31. The second actuator Ac2 forces to displace the third frame layer 33 to the column direction corresponding to the second frame layer 32. The first actuator Ac1 and the second actuator Ac2 is constituted as a comb-like electrostatic type. Further, the first actuator Ac1 and the second actuator Ac2 may be constituted with a piezo-type element or a thermal-expansion type element.

Further, a memory hole 37 is configured at a portion as aligning the source-side columnar semiconductor 25 to pass through the interlayer insulator 35, the first-fourth word line conduction layers 36a-36d, the third frame bottom layer 33b, the third protective layer 33c, the first protective layer 31a and the isolation insulator 34. A memory 38 is formed at a portion as aligning the source-side columnar semiconductor 25 in the memory hole 37. The memory 38 is formed of silicon. The fourth space Ag4 is configured between the memory 38 and a block insulation layer 39c mentioned after. The memory 38 is fixed corresponding to the semiconductor substrate Ba.

Figure 6:
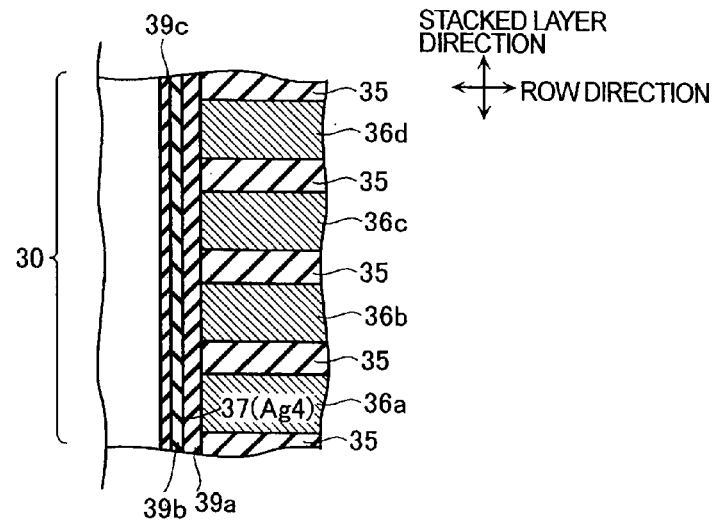
FIG. 6 is an enlarged view of FIG. 4.

FIG. 6 is an enlarged view of FIG. 4. As shown in FIG. 6, a block insulation layer 39a, a charge storage layer 39b and a tunnel insulation layer 39c are formed on sidewalls of the first-fourth word line conduction layers 36a-36d in the memory hole 37 in order. The block insulation layer 39a is formed of silicon-dioxide. The charge storage layer 39b is formed of silicon-nitride (SiN). The tunnel insulation layer 39c is formed of silicon-dioxide.

Figure 7:
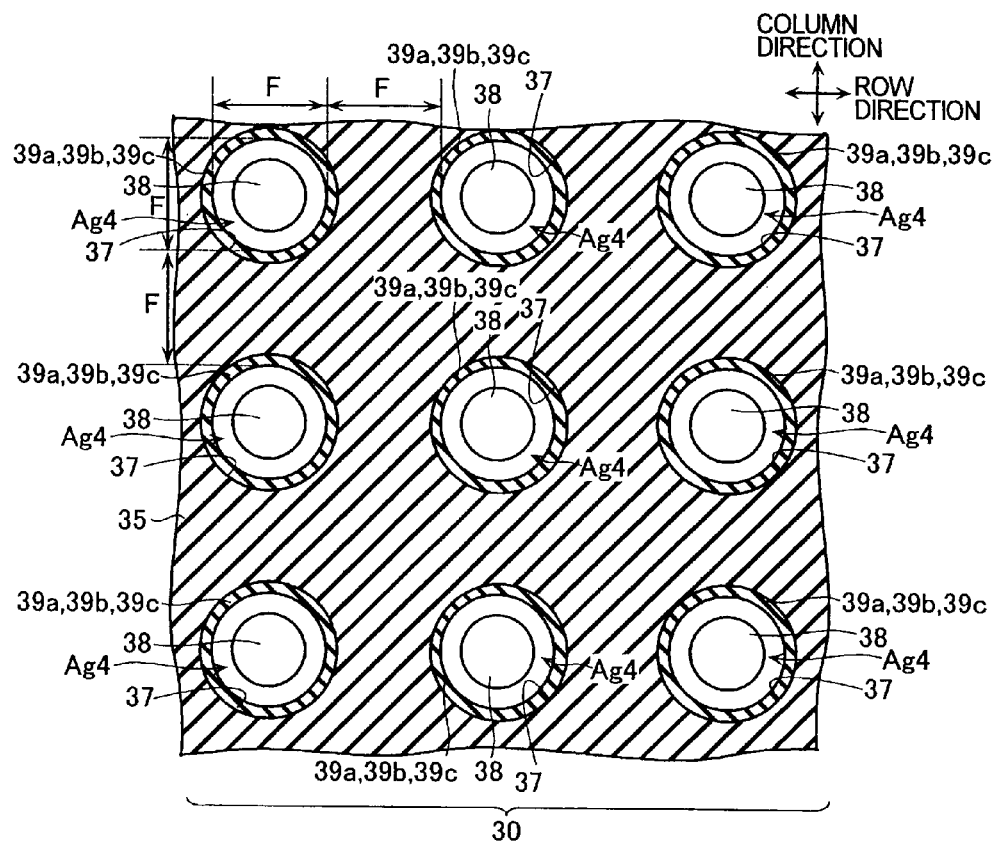
FIG. 7 is a part of a schematic plain view showing a memory hole of the nonvolatile memory semiconductor device according to the first embodiment of the present invention.

FIG. 7 is a part of schematic plain view showing the memory layer 30 as shown FIG. 4. As shown in FIG. 4 and FIG. 7, a diameter of the memory hole 37 is formed to be larger than a diameter of the memory 38. The fourth space Ag4 is formed between the memory hole 37 and the memory 38. For example, the diameter of the memory hole 37 is "F" and the shortest distance between the nearest memory holes 37 is "F". In this condition, R is expressed by $R=\pi F/4F^2 \approx 0.79/F$, where R is a ratio of the circular length of a charge storage layer per area corresponding to an area of the memory hole 37.

In other word of the constitution of the memory layer 30, the first-fourth word line conduction layers 36a-36d are formed parallel to the semiconductor substrate Ba and includes the fourth space Ag4 between the memories 38. Further, the charge storage layer 39b is formed on a sidewall of the first-fourth word line conduction layers 36a-36d faced to the fourth space Ag4.

As shown in FIG. 4, the drain-side selection transistor layer 40 includes a first drain-side insulation layer 41 on the periphery insulation layer 31b, a drain-side conductive layer 42 on the first drain-side insulation layer 41, and a second drain-side insulation layer 43 on the drain-side conductive layer 42. Here, the drain-side selection transistor layer 40 (first drain-side insulation layer 41) is formed on the memory layer 30 via a fifth space Ag5. The first drain-side insulation layer 41, the drain-side conductive layer 42 and the second drain-side insulation layer 43 are formed as stripe patterns having a prescribe pitch to the column direction and extending to the row direction. An interlayer insulator is configured to column direction of the first drain-side insulation layer 41, the drain-side conductive layer 42 and the second drain-side insulation layer 43 formed as stripe patterns (not illustrated). For example, the first drain-side insulation layer 41 and the drain-side second insulation layer 43 are formed of silicon-dioxide. The drain-side conductive layer 42 is formed of silicon. Further, one end of the drain-side conductive layer 42 acts as a control gate of the drain-side selection transistor SDTrmn mentioned above.

Further, the drain-side selection transistor layer 40 passes through the first drain-side insulation layer 41, the drain-side conductive layer 42 and the second drain-side insulation layer 43, to include a drain-side hole 44 and a drain-side columnar semiconductor layer 45 formed in the drain-side hole 44. A drain-side gate insulation layer 46 is formed between a sidewall of the drain-side columnar semiconductor layer 45 and the first drain-side insulation layer 41, the drain-side conductive layer 42 and the second drain-side insulation layer 43. The drain-side columnar semiconductor layer 45 is formed of amorphous silicon. The drain-side gate insulation layer 46 is formed of silicon-dioxide.

A bit line layer 47 is formed at a portion being aligned with the drain-side columnar semiconductor layer 45 and an upper portion of the drain-side columnar semiconductor layer 45. The bit line layer 47 acts as the bit line BL as shown in FIG. 2.

(A Mechanism of the Nonvolatile Semiconductor Memory Device 100)

Figures 8A, 8B:
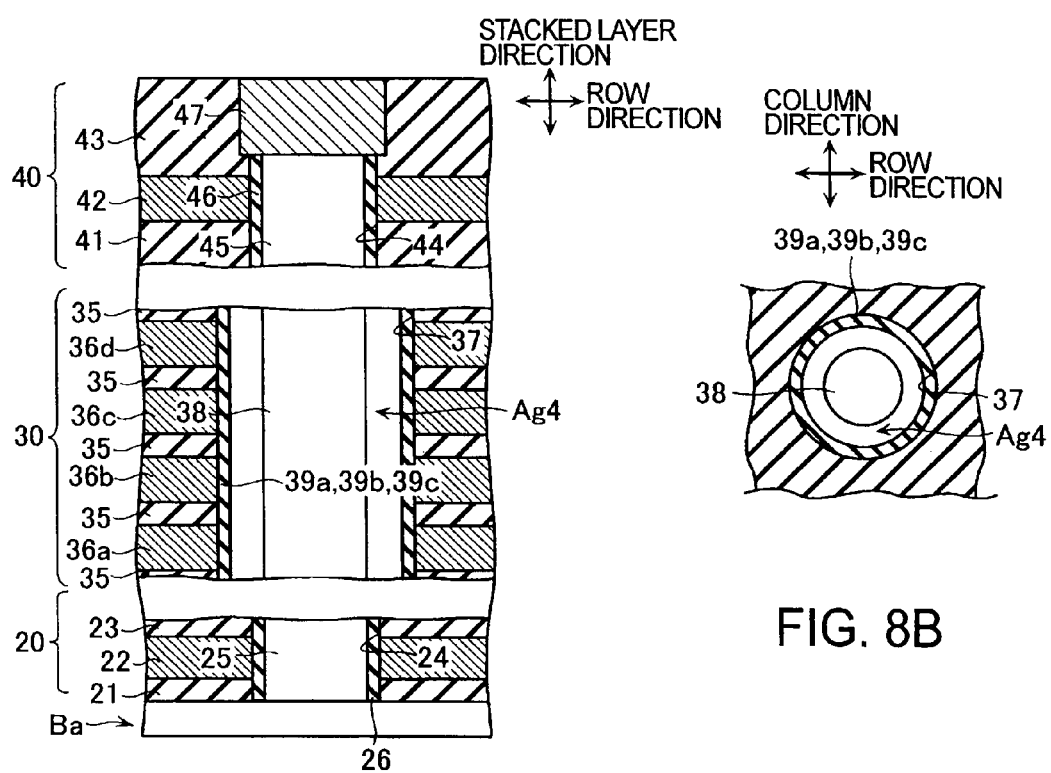
FIG. 8A-8B are a cross-sectional schematic view and a plan view showing a mechanism of the nonvolatile memory semiconductor device according to the first embodiment of the present invention.

Next, as reference to FIG. 8 and FIG. 9, a mechanism of the nonvolatile semiconductor memory device is explained. FIG. 8A is a cross-sectional schematic view showing the memory strings MS of the nonvolatile memory semiconductor device in normal state, and FIG. 8A is a plan view showing the memory strings MS of the nonvolatile memory semiconductor device in normal state. FIG. 9A is a cross-sectional schematic view showing the memory strings MS of the nonvolatile memory semiconductor device when the second frame layer 32 moves and FIG. 9B-9E are plan views showing the memory strings MS of the nonvolatile memory semiconductor device when the second frame layer 32 moves. FIG. 9B-9E show that the memory 38 is moved to approach at a prescribed portion of a sidewall in the opening. Four points in FIG. 9B-9E is shown as an example, therefore, another point can be also applicable.

On the constitution mentioned above, the second frame layer 32 and a layer formed in the second frame layer 32, and a layer formed in the third frame layer 33 and the third frame layer 33 are moved to the row direction by the first actuator Ac1. The third frame layer 33 and a layer formed in the third frame layer 33 are moved to the column direction by the second actuator Ac2.

As shown in FIG. 8, in the normal state, the center of the memory 38 being constituted with the memory strings MS is corresponded to the center of the memory hole 37 by the first actuator Ac1 and the second actuator Ac2.

Figure 9A:
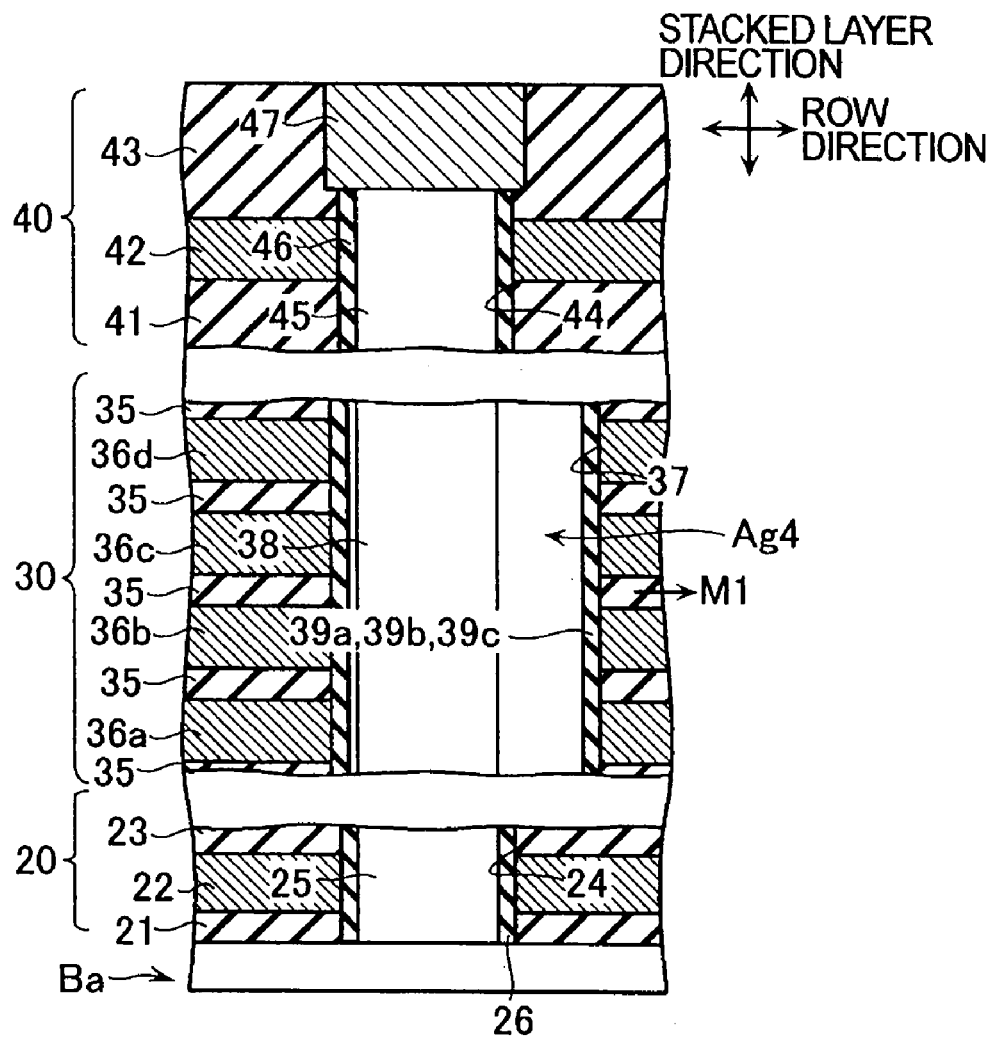
FIG. 9A-9E are a cross-sectional schematic view and plan views showing the mechanism of the nonvolatile memory semiconductor device according to the first embodiment of the present invention.
Figure 9B:
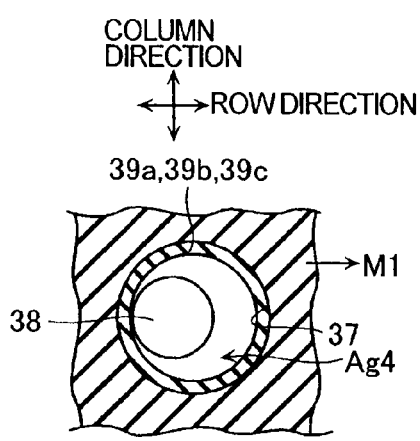
Figure 9C:
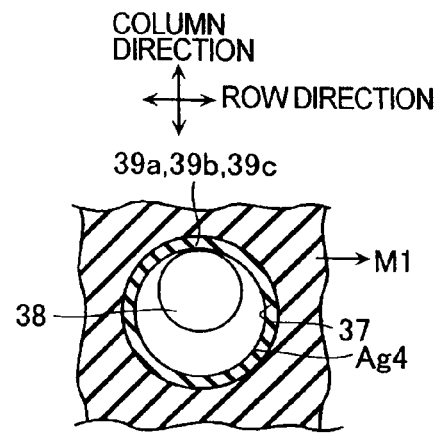
Figure 9D:
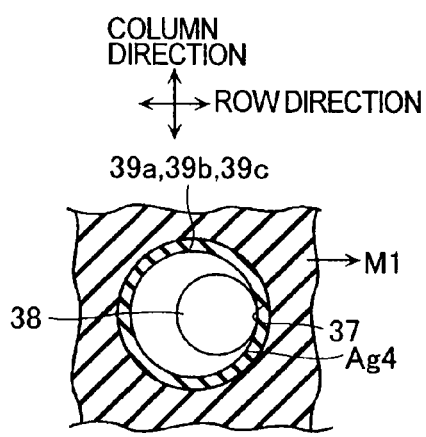
Figure 9E:
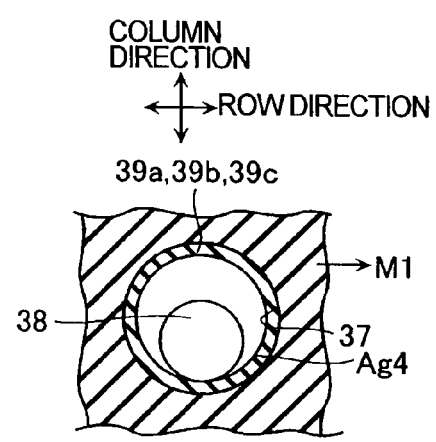

On the other hand, the third frame layer 33 moves to the column direction and the row-direction (arrow M1 illustrated in FIG. 9B) by the first actuator Ac1 and the second actuator Ac2, when writing in data and reading out data. Namely, first-fourth word line conduction layers 36a-36d relatively move to the memory 38. As shown in FIG. 9A, in the memory string MS, the center of the memory 38 is moved from the center to an eccentric portion in the memory hole 37 accompanying with the movement. In other word, a part of the sidewall of the memory 38 approaches to a part of the charge storage layer 39b. Furthermore, as shown in FIG. 9A, for example, when the fourth word line conduction layer 36d is applied to voltage, the memory 38 is performed to write in data into the approached portion of the charge storage layer 39b and read out data from the approached portion of the charge storage layer 39b. Here, a relative moving distance of the charge storage layer 39b corresponding to the memory 38 has a maximum value of approximately 10 nm. As shown in FIG. 9B-9E, writing in data and reading data are performed at the four points of a circular of the charge storage layer 39b around the memory hole 37 (fourth space Ag4) by changing the moving direction of the first-fourth word line conduction layers 36a-36d mentioned above. The portions are related to both the row-direction and the column direction. Furthermore, eight points, sixteen points and another case are also applicable. Data processing can be performed with effectively dividing the circular of the charge storage layer 39b.

(Method for Fabricating the Nonvolatile Semiconductor Memory Device 100 According to the First Embodiment)

Figure 10:
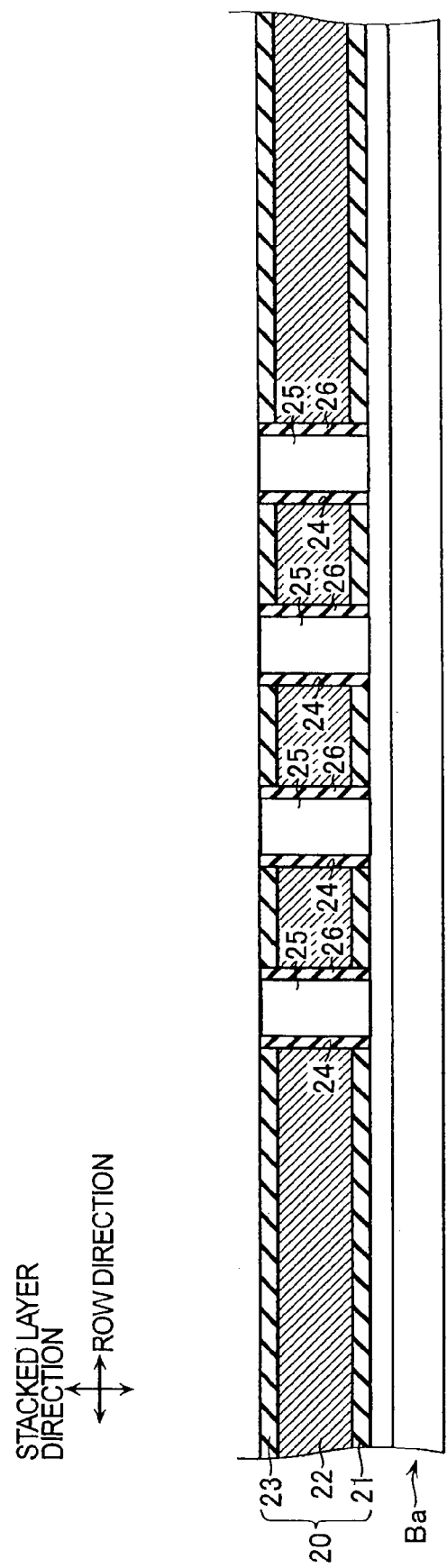
FIG. 10 is a cross-sectional schematic view showing processing steps for fabricating the nonvolatile memory semiconductor device according to the first embodiment of the present invention.

Next, as reference to FIG. 10-FIG. 26, it is explained on processing steps for fabricating the nonvolatile semiconductor memory device 100 according to the first embodiment. First, as shown in FIG. 10, the source-side transistor layer 20 is formed on the semiconductor substrate Ba.

Figure 11:
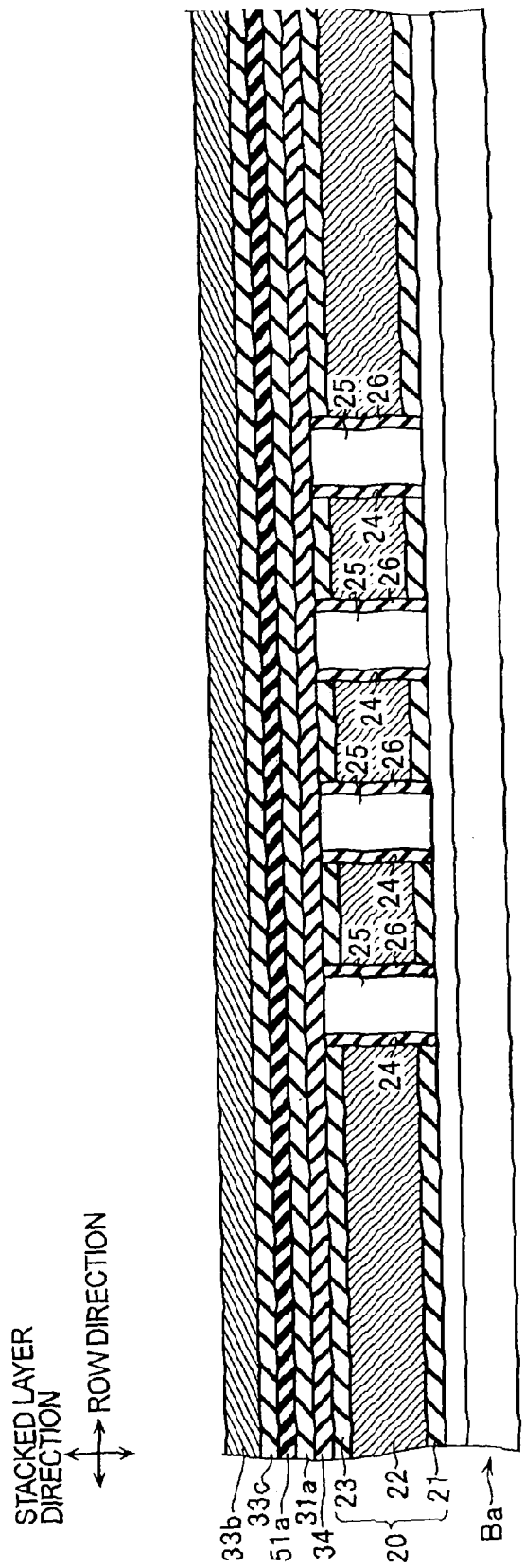
FIG. 11 is a cross-sectional schematic view showing the processing steps for fabricating the nonvolatile memory semiconductor device according to the first embodiment of the present invention.

As shown in FIG. 11, a silicon-nitride film, a silicon-oxide film, a germanium-silicon (SiGe) film, a silicon-oxide film and a silicon film are deposited to form the isolation insulator 34, the first protective layer 31a, the first sacrifice layer 51a, the second protective layer 33c and the third frame bottom layer 33b.

Figure 12:
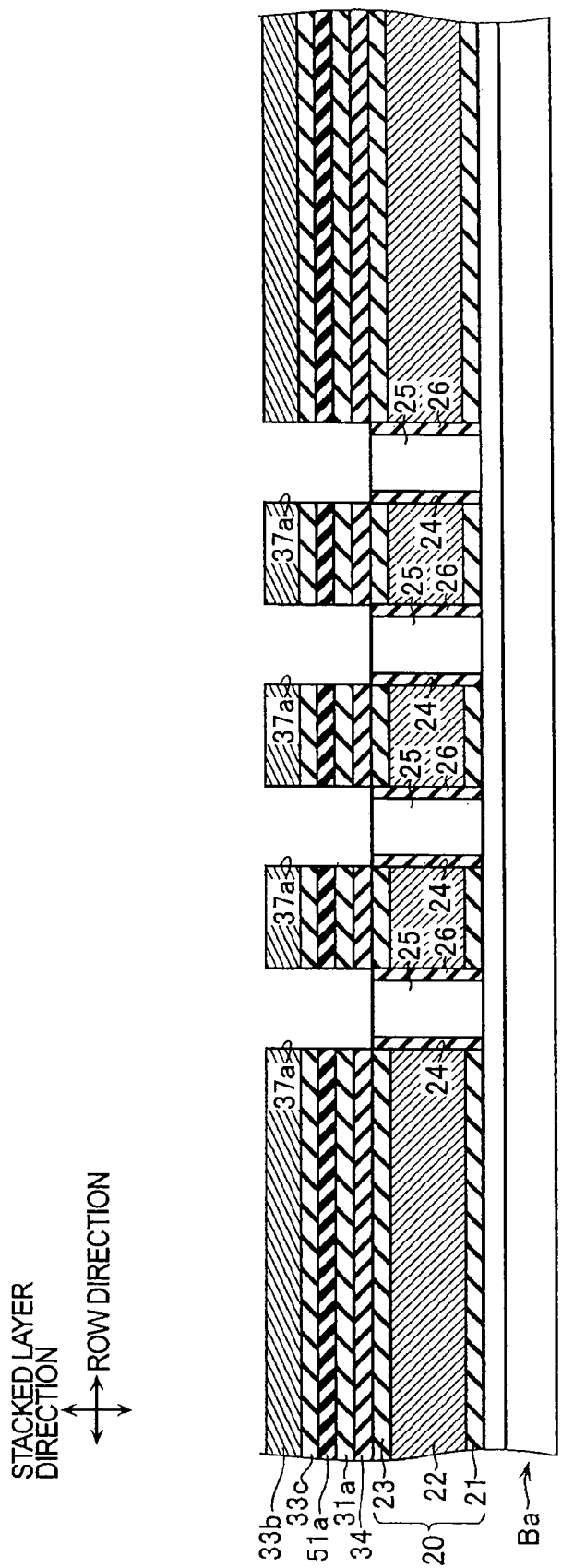
FIG. 12 is a cross-sectional schematic view showing the processing steps for fabricating the first embodiment of the present invention.

As shown in FIG. 12, the first memory hole 37a is formed at a portion being aligned with the source-side columnar semiconductor layer 25 to pass through the third frame bottom layer 33b, the second protective layer 33c, a first sacrifice layer 51a, the first protective layer 31a and the isolation insulator 34.

Figure 13:
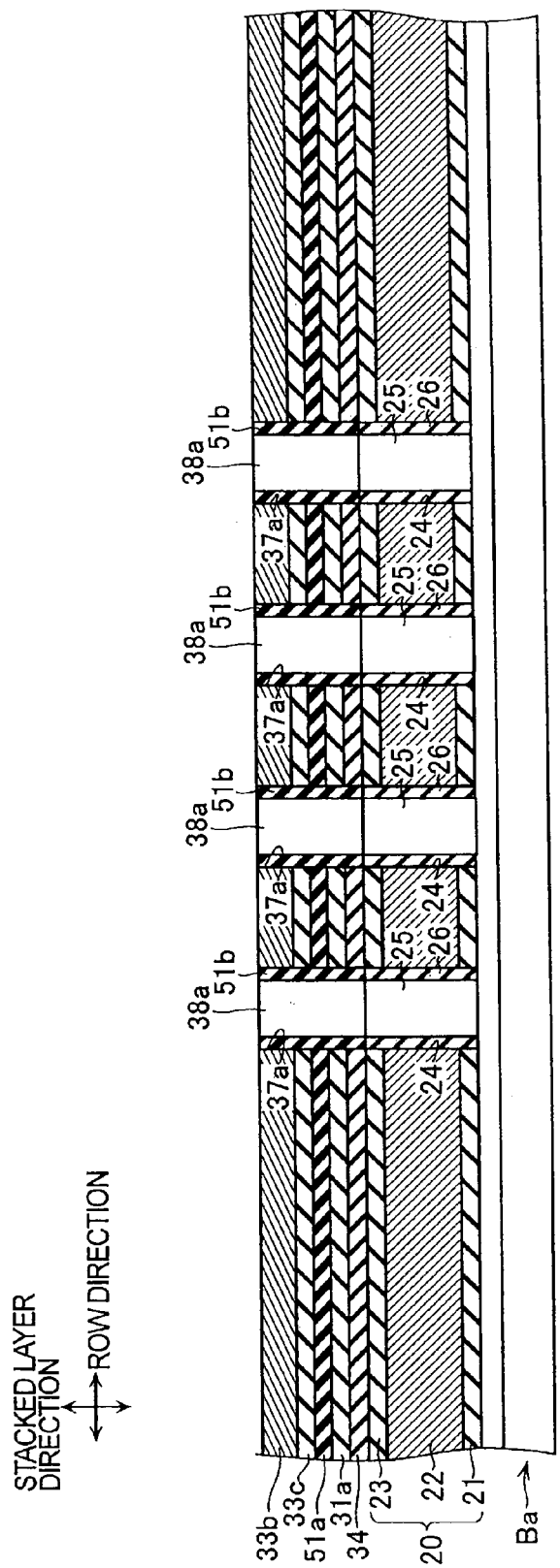
FIG. 13 is a cross-sectional schematic view showing the processing steps for fabricating the nonvolatile memory semiconductor device according to the first embodiment of the present invention.

As shown in FIG. 13, a germanium-silicon film and an amorphous silicon film are deposited on a sidewall of the first memory hole 37a in order, successively, the germanium-silicon film and the amorphous silicon film are anisotropically etched to form a second sacrifice layer 51b and the first memory 38a.

Figure 14:
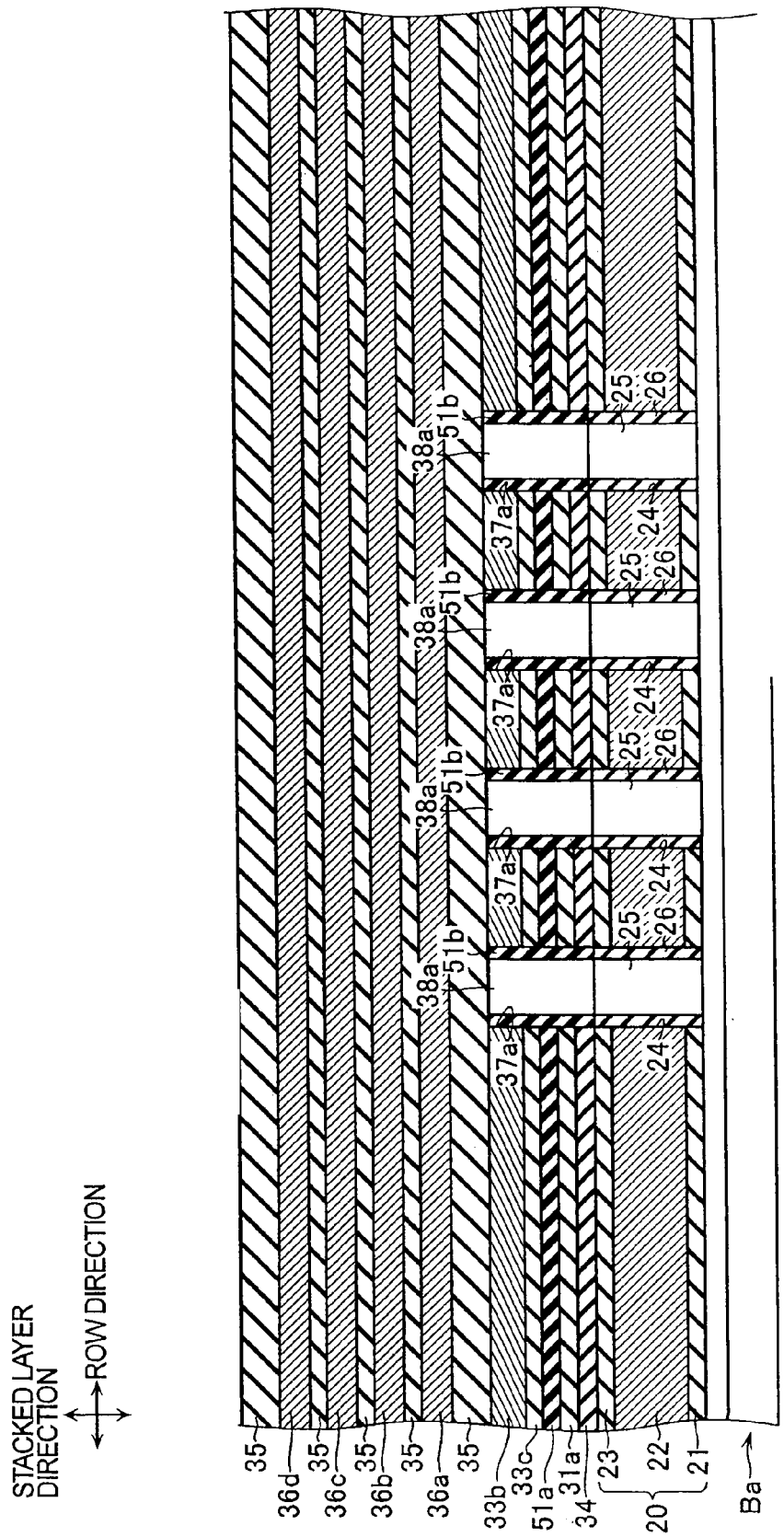
FIG. 14 is a cross-sectional schematic view showing the processing steps for fabricating the nonvolatile memory semiconductor device according to the first embodiment of the present invention.

As shown in FIG. 14, a silicon-oxide film and a silicon film are alternately deposited on a top surface of the first memory 38a, a top surface of the second sacrifice layer 51b and a top surface of the third frame bottom layer 33b, to form the first-fourth word line conduction layers 36a-36d and to form the interlayer insulator 35 on both surfaces of each of the first-fourth word line conduction layers 36a-36d.

Figure 15:
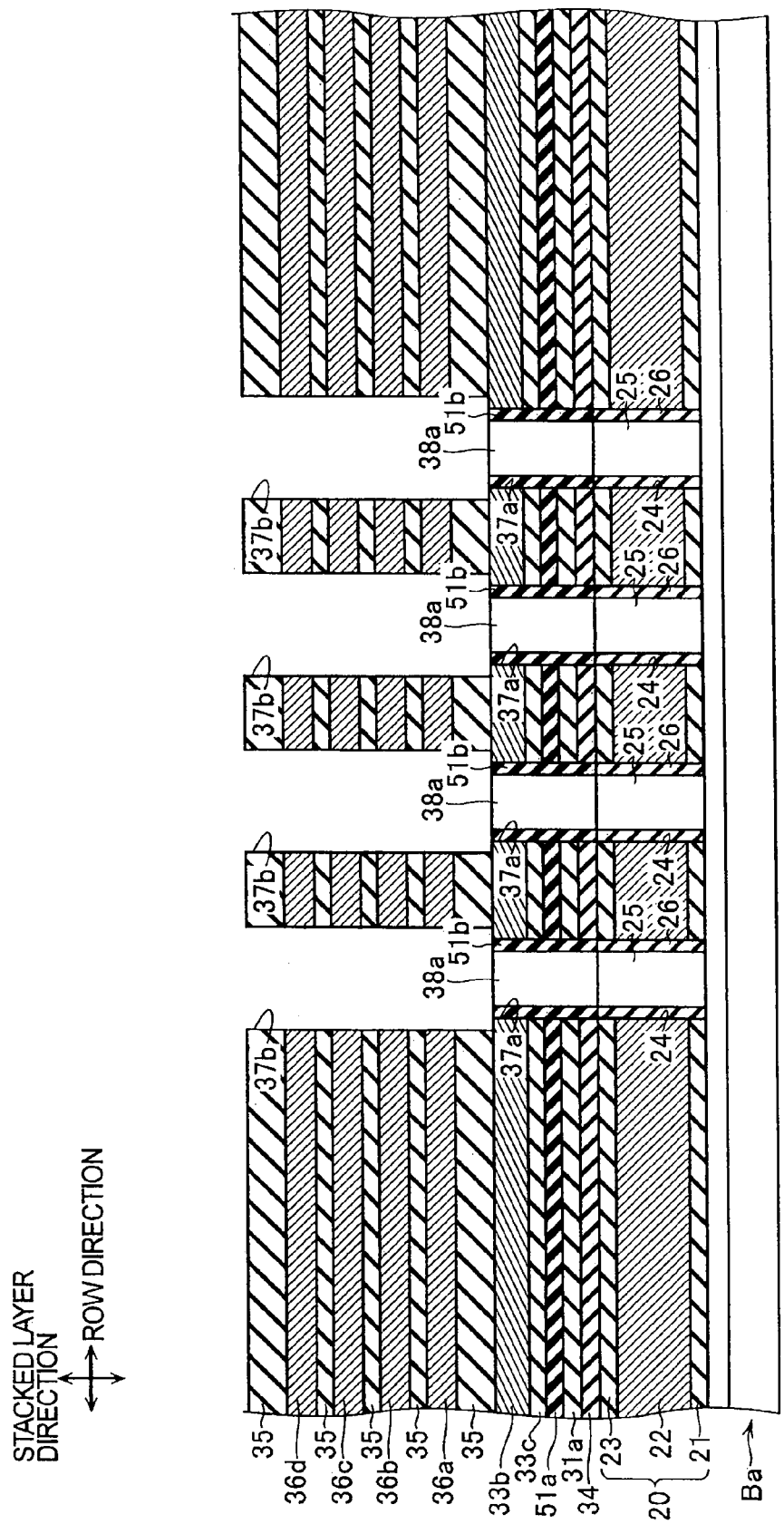
FIG. 15 is a cross-sectional schematic view showing the processing steps for fabricating the nonvolatile memory semiconductor device according to the first embodiment of the present invention.

As shown in FIG. 15, the second memory hole 37b is formed at a portion being aligned with the first memory hole 37a to pass through the first-fourth word line conduction layers 36a-36d and the interlayer insulator 35 formed on both surfaces of each of the first-fourth word line conduction layers 36a-36d. Further, the memory hole 37 is constituted with both the first memory hole 37a and the second memory hole 37b.

Figure 16:
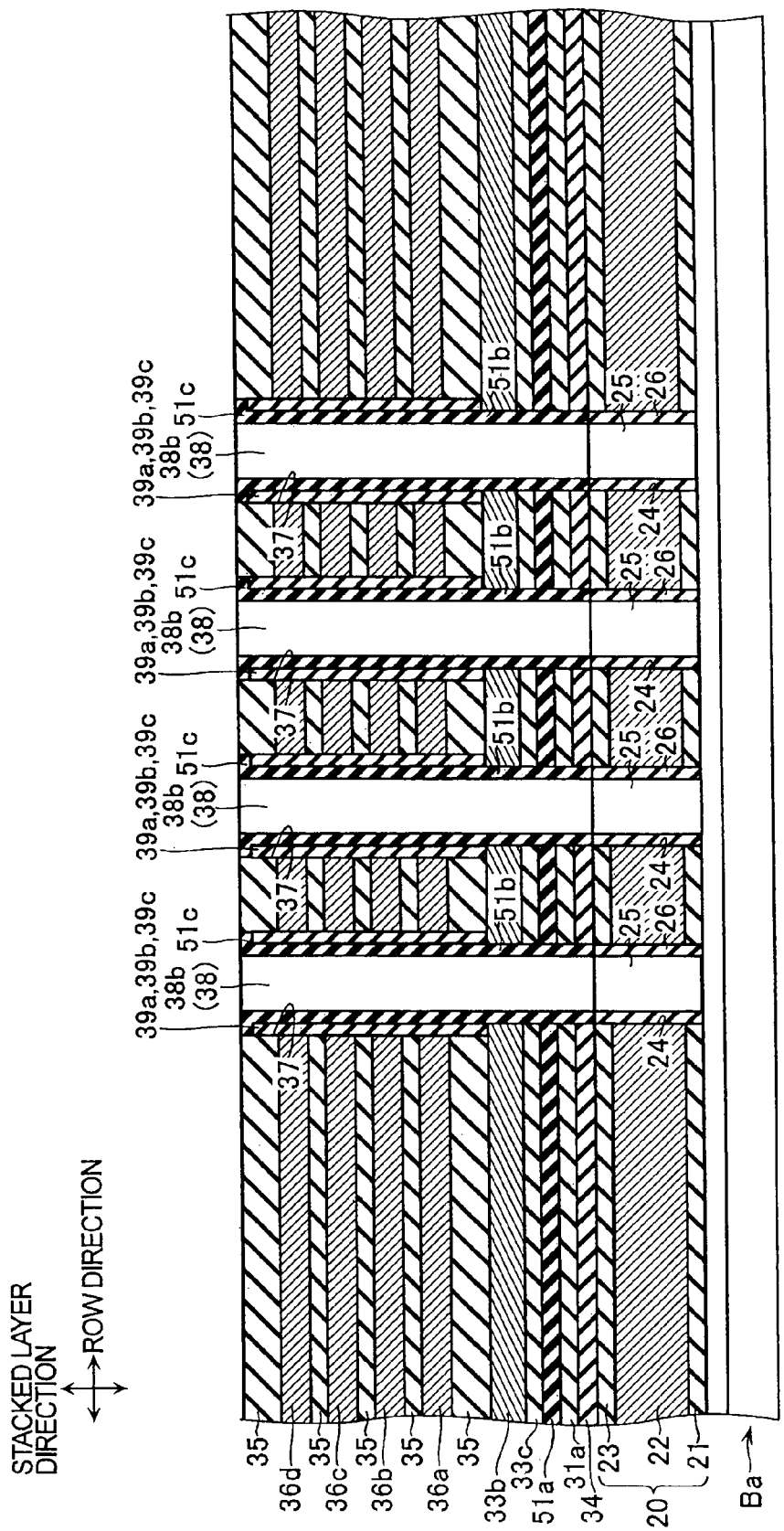
FIG. 16 is a cross-sectional schematic view showing the processing steps for fabricating the nonvolatile memory semiconductor device according to the first embodiment of the present invention.

As shown in FIG. 16, a silicon-oxide film, a silicon-nitride film, a silicon-oxide film, a germanium-silicon film and an amorphous silicon film are deposited on the sidewall of the second memory hole 37b in order. Subsequently by etching, the block insulation layer 39a, the charge storage layer 39b, the tunnel insulation layer 39c, a third sacrifice layer 51c and the second memory 38b. The memory 38 is constituted with both the first memory 38a and the second memory 38b.

Figure 17:
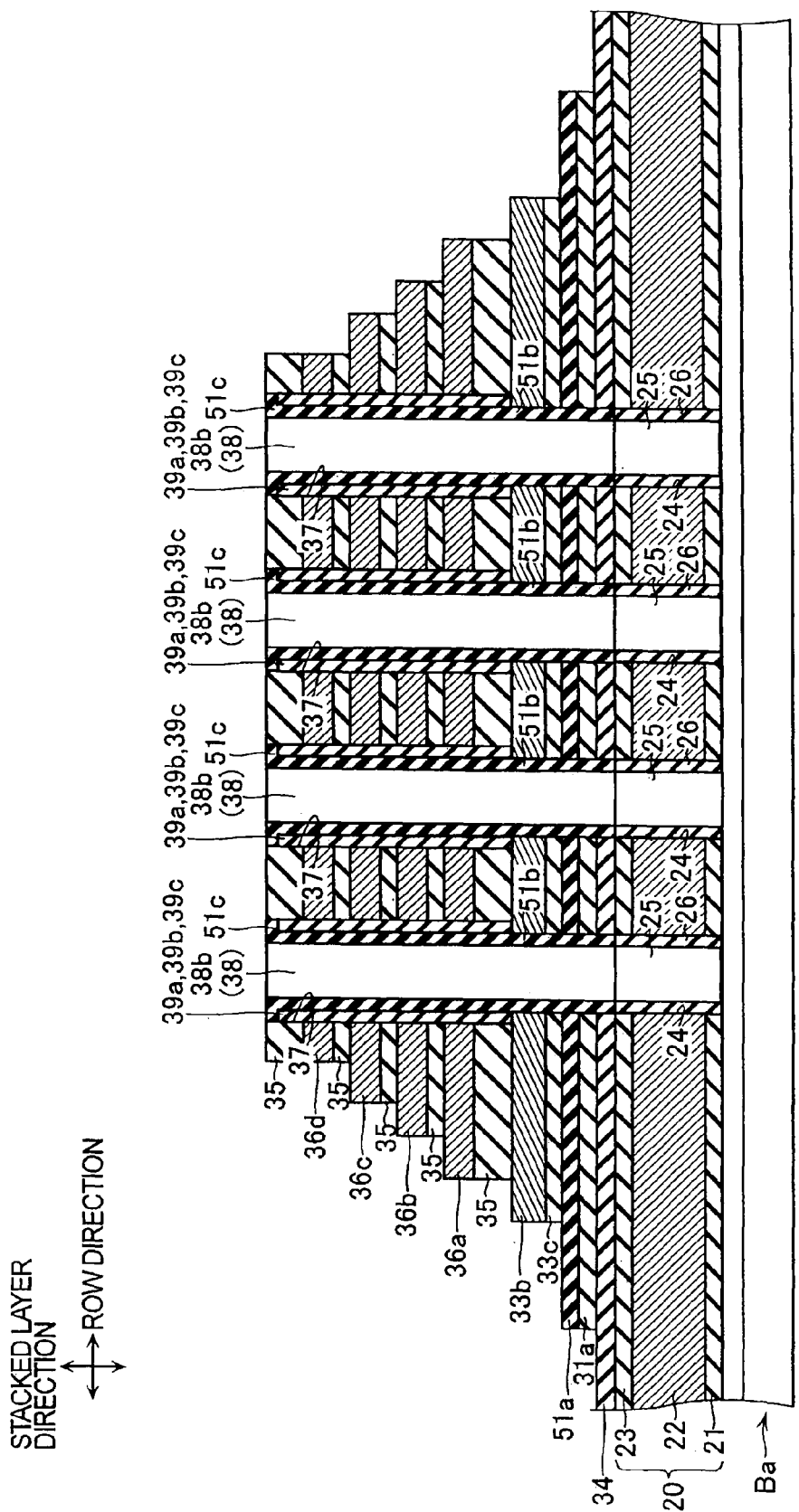
FIG. 17 is a cross-sectional schematic view showing the processing steps for fabricating the nonvolatile memory semiconductor device according to the first embodiment of the present invention.

As shown in FIG. 17, each of the first protective layer 31a, the first sacrifice layer 51a, the third frame bottom layer 33b, the first-fourth word line conduction layers 36a-36d and the interlayer insulator 35 are delineated to be formed into a shape of stairs.

Figure 18:
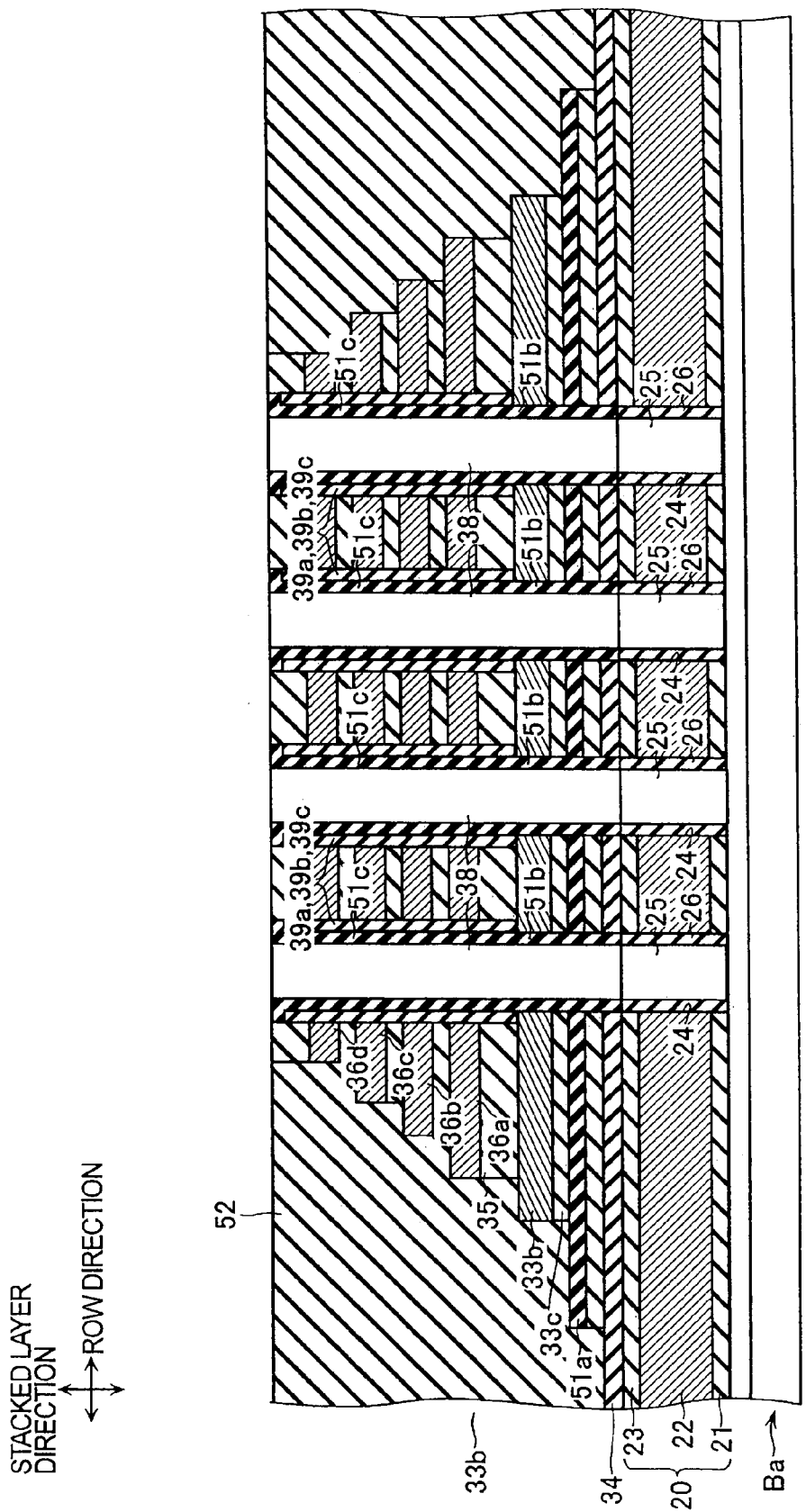
FIG. 18 is a cross-sectional schematic view showing the processing steps for fabricating the nonvolatile memory semiconductor device according to the first embodiment of the present invention.

As shown in FIG. 18, a silicon-oxide film is deposited to a top surface of the memory 38 to form an interlayer insulator 52.

Figure 19:
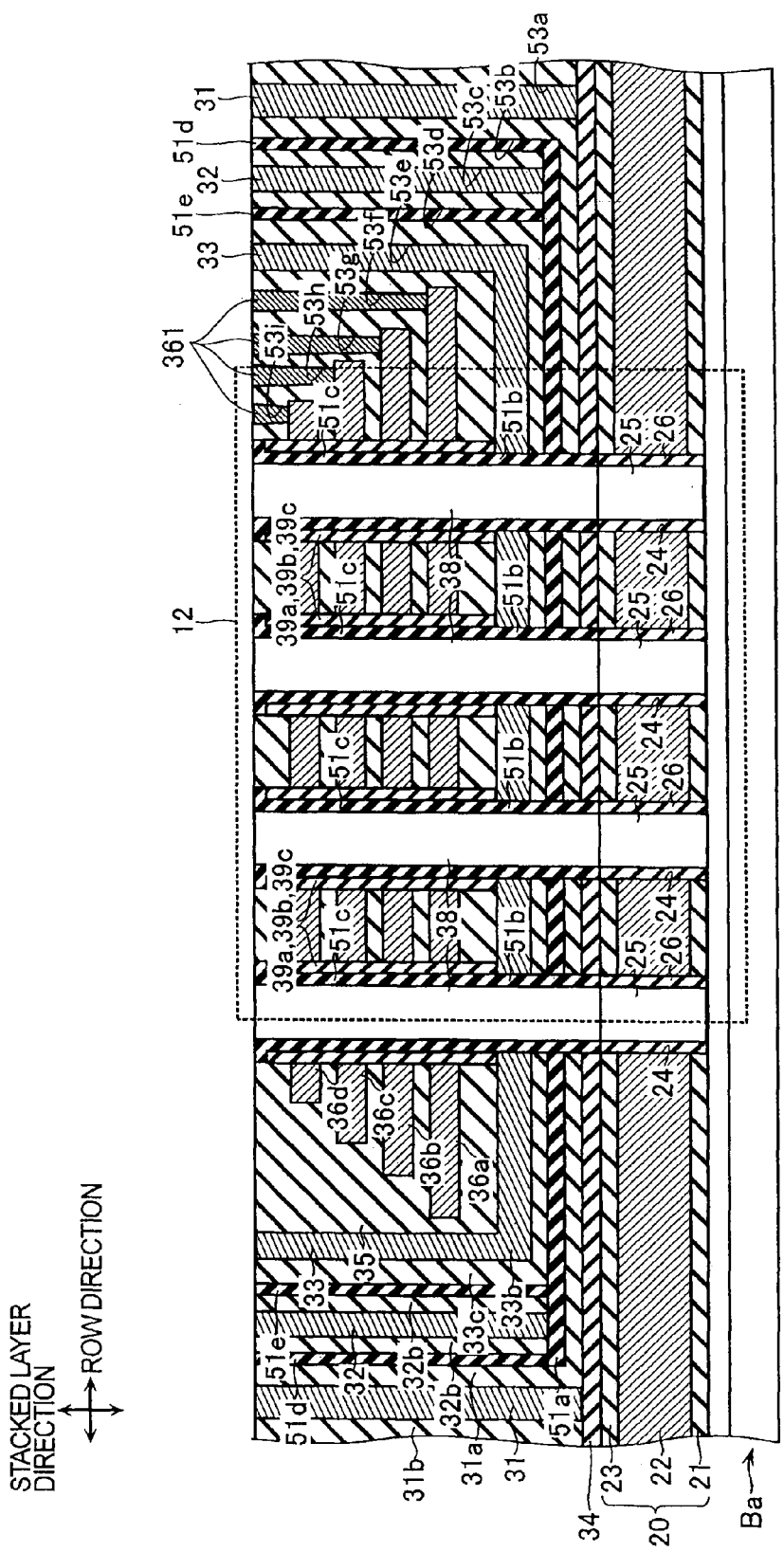
FIG. 19 is a cross-sectional schematic view showing the processing steps for fabricating the nonvolatile memory semiconductor device according to the first embodiment of the present invention.

As shown in FIG. 19, a first groove 53a is formed onto the isolation insulator 34 to pass through the interlayer insulator 52. The first groove 53a is formed as a rectangle frame surrounding the memory cell region 12 from top view. A silicon film is deposited on the first groove 53a to form the first frame layer 31.

A second groove 53b is formed to pass through the interlayer insulator 52 to a top surface of the first sacrifice layer 51a. The second groove 53b is formed at nearer side as the memory cell region 12 than the first groove 53a, the shape of the second groove 53b from top view is formed as a rectangle surrounding the memory cell region 12. A germanium-silicon film is deposited on the second groove 53b to form a fourth sacrifice layer 51d.

A third groove 53c is formed to pass through the interlayer insulator 52 to the upper surface of the first sacrifice layer 51a. The third groove 53c is formed at nearer side as the memory cell region 12 than the second groove 53b, the shape of the third groove 53c from top view is formed as a rectangle surrounding the memory cell region 12. A silicon film is deposited on the third groove 53c to form the second frame layer 32.

A fourth groove 53d is formed to pass through the interlayer insulator 52 to the upper surface of the first sacrifice layer 51a. The fourth groove 53d is formed at nearer side as the memory cell region 12 than the third groove 53c, the shape of the fourth groove 53d from top view is formed as a rectangle surrounding the memory cell region 12. A germanium-silicon film is deposited on the fourth groove 53d to form a fifth sacrifice layer 51e.

A fifth groove 53e is formed to pass through the interlayer insulator 52 to an upper surface of the third frame bottom layer 33b. The fifth groove 53e is formed at nearer side as the memory cell region 12 than the fourth groove 53d, the shape of the fifth groove 53e from top view is formed as a rectangle surrounding the memory cell region 12. A silicon film is deposited on the fourth groove 53d to form the third frame 33.

Furthermore, each of first-fourth holes 53f-53i is formed to pass through the interlayer insulator 52 to an end of each of first-fourth word line conduction layers 36a-36d in the row-direction. A silicon film is deposited on the first-fourth holes 53f-53i to form the plug conductive layer 361.

Figure 20:
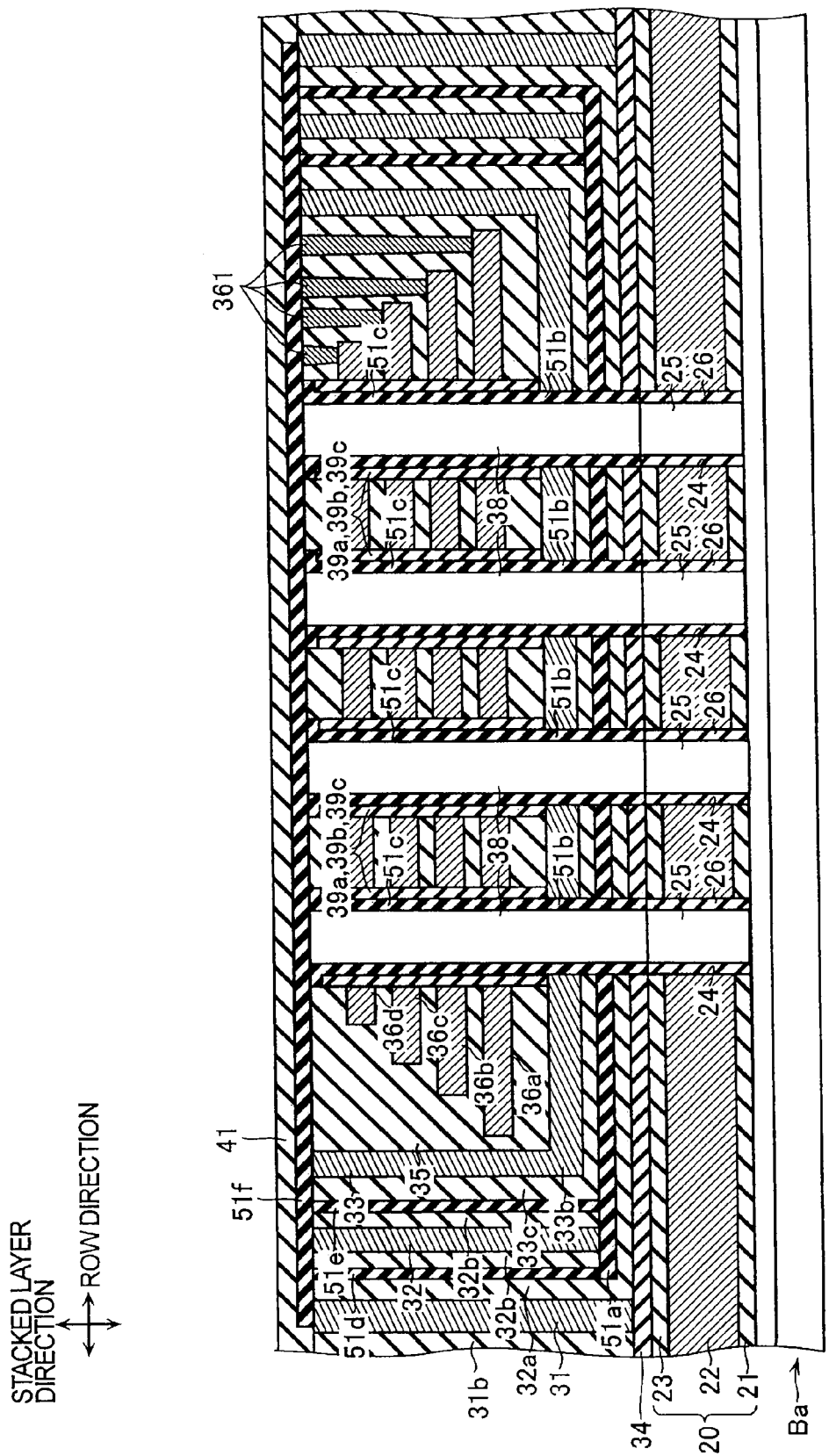
FIG. 20 is a cross-sectional schematic view showing the processing steps for fabricating the nonvolatile memory semiconductor device according to the first embodiment of the present invention.

As shown in FIG. 20, a sixth sacrifice layer 51f is formed on the memory 38 and an upper surface of the first frame layer 31. Subsequently, a silicon-oxide film is deposited on the sixth sacrifice layer 51f to form the drain-side first insulation layer 41.

Figure 21:
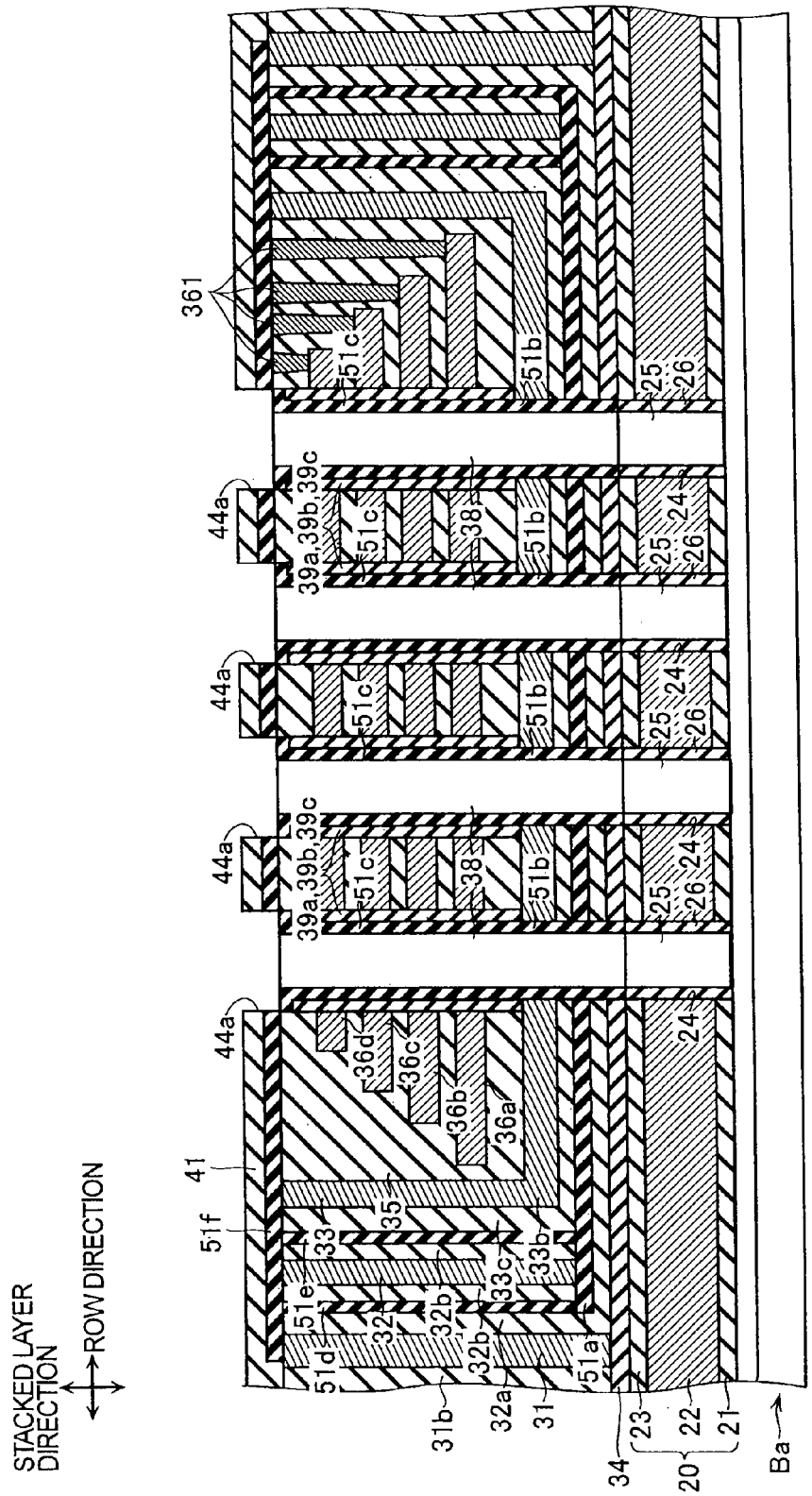
FIG. 21 is a cross-sectional schematic view showing the processing steps for fabricating the nonvolatile memory semiconductor device according to the first embodiment of the present invention.

As shown in FIG. 21, a first drain-side hole 44a is formed at a portion being aligned with the memory hole 37 to pass through the drain-side first insulation layer 41 and the sixth sacrifice layer 51f.

Figure 22:
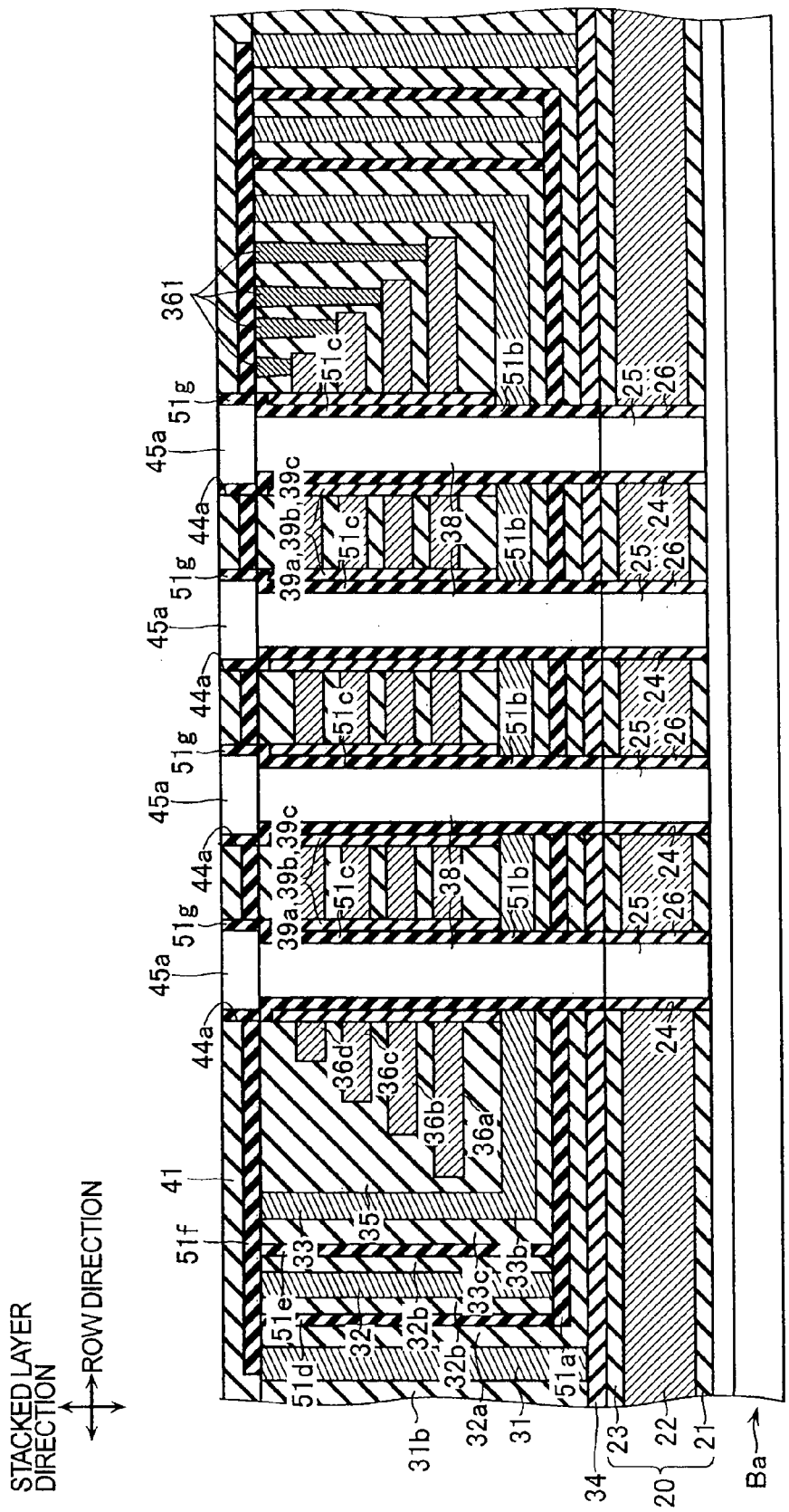
FIG. 22 is a cross-sectional schematic view showing the processing steps for fabricating the nonvolatile memory semiconductor device according to the first embodiment of the present invention.

As shown in FIG. 22 a germanium-silicon film and a silicon film are deposited on a sidewall of the first drain-side hole 44a and the germanium-silicon film and the silicon are anisotropically etched to form a seventh sacrifice layer 51g and the drain-side first columnar semiconductor layer 45a.

Figure 23:
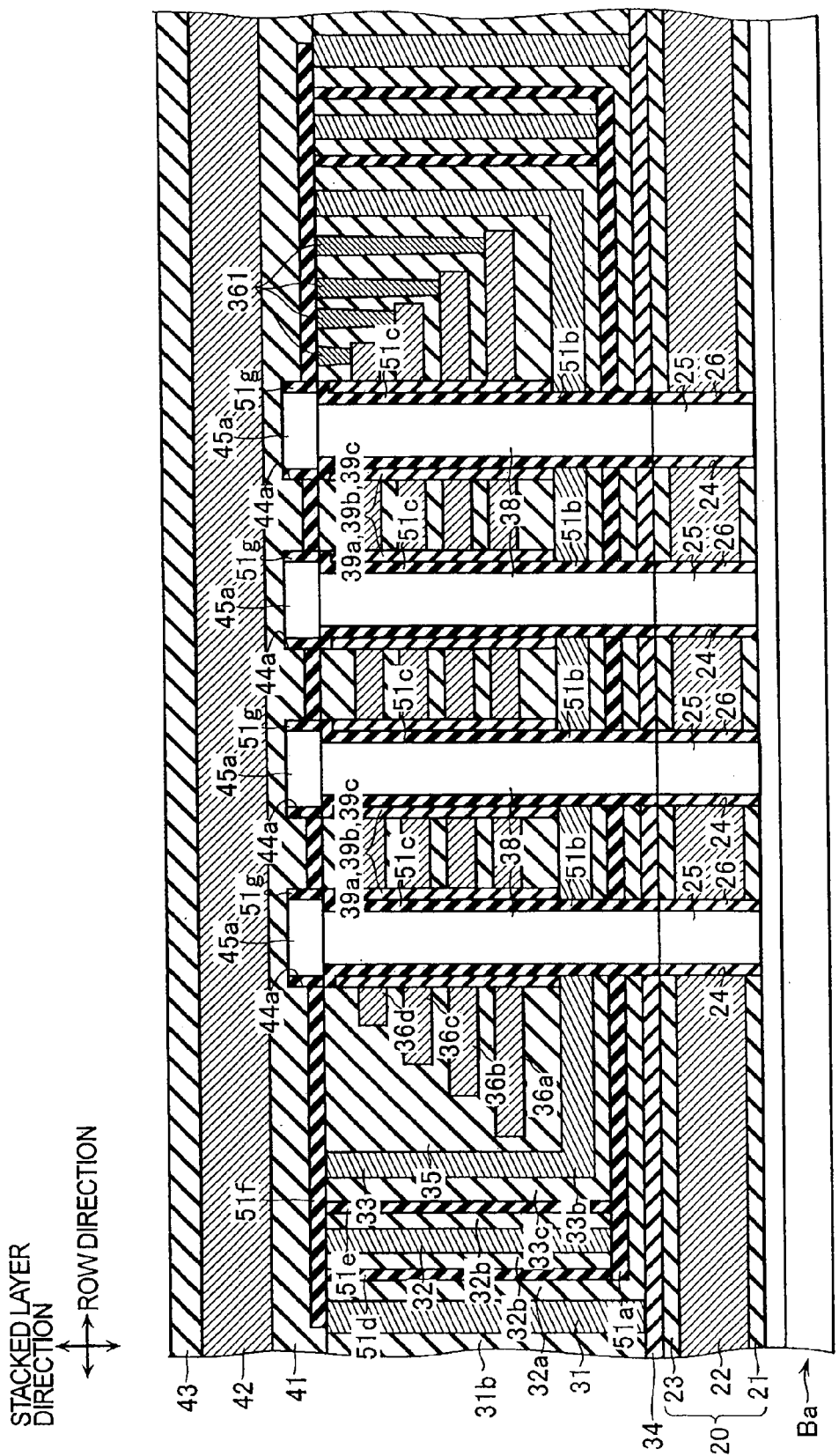
FIG. 23 is a cross-sectional schematic view showing the processing steps for fabricating the nonvolatile memory semiconductor device according to the first embodiment of the present invention.

As shown in FIG. 23, the drain-side first insulation layer 41 is deposited, subsequently a silicon film and a silicon-oxide film deposited on the drain-side first insulation layer 41 to form the drain-side conductive layer 42 and the drain-side second insulation layer 43.

Figure 24:
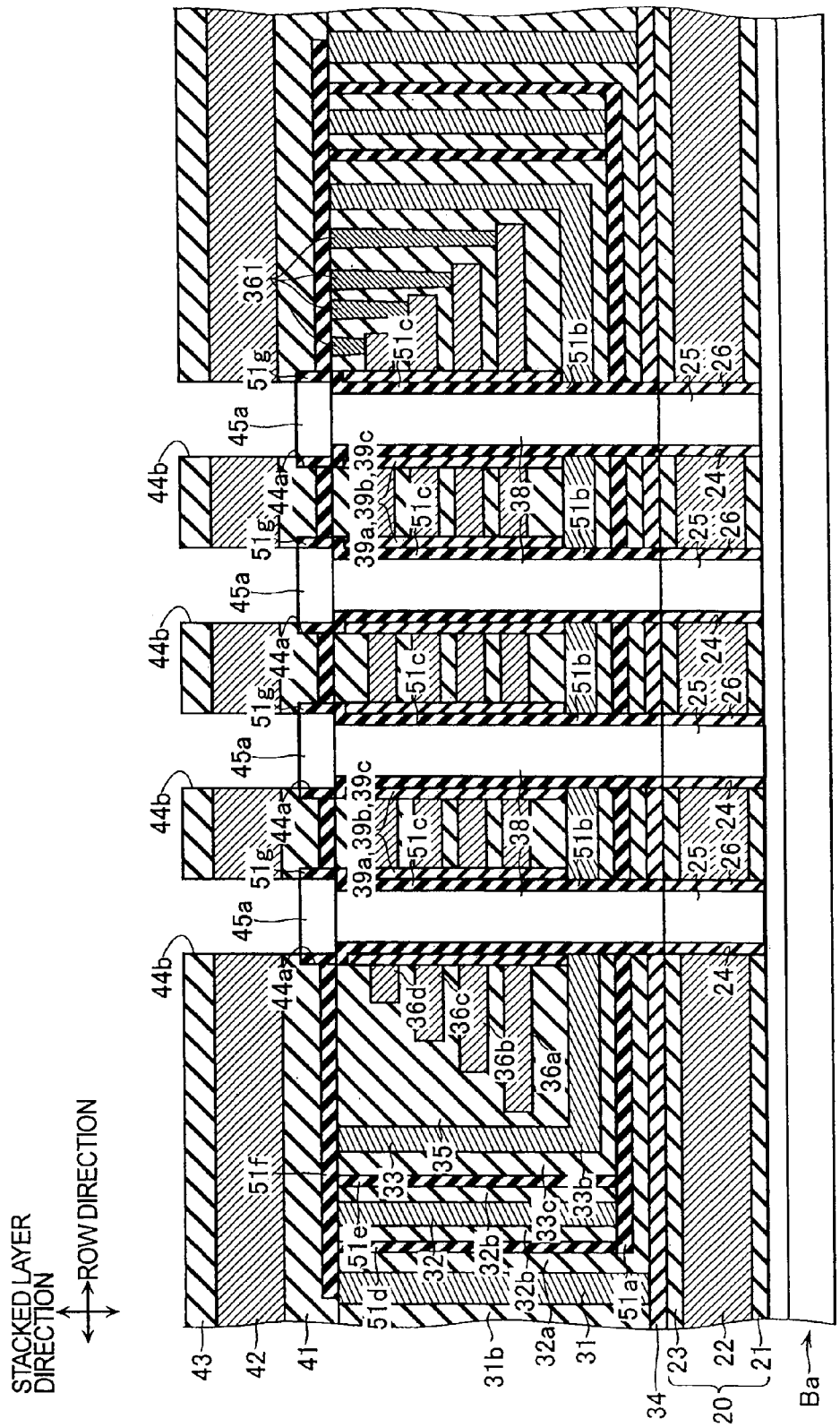
FIG. 24 is a cross-sectional schematic view showing the processing steps for fabricating the nonvolatile memory semiconductor device according to the first embodiment of the present invention.

As shown in FIG. 24, a second drain-side hole 44b is formed at a portion being aligned with the drain-side first hole 44a to pass through the drain-side second insulation layer 43 and the drain-side conductive layer 42. The drain-side hole 44 is constituted with both the drain-side first hole 44a and the drain-side second hole 44b.

Figure 25:
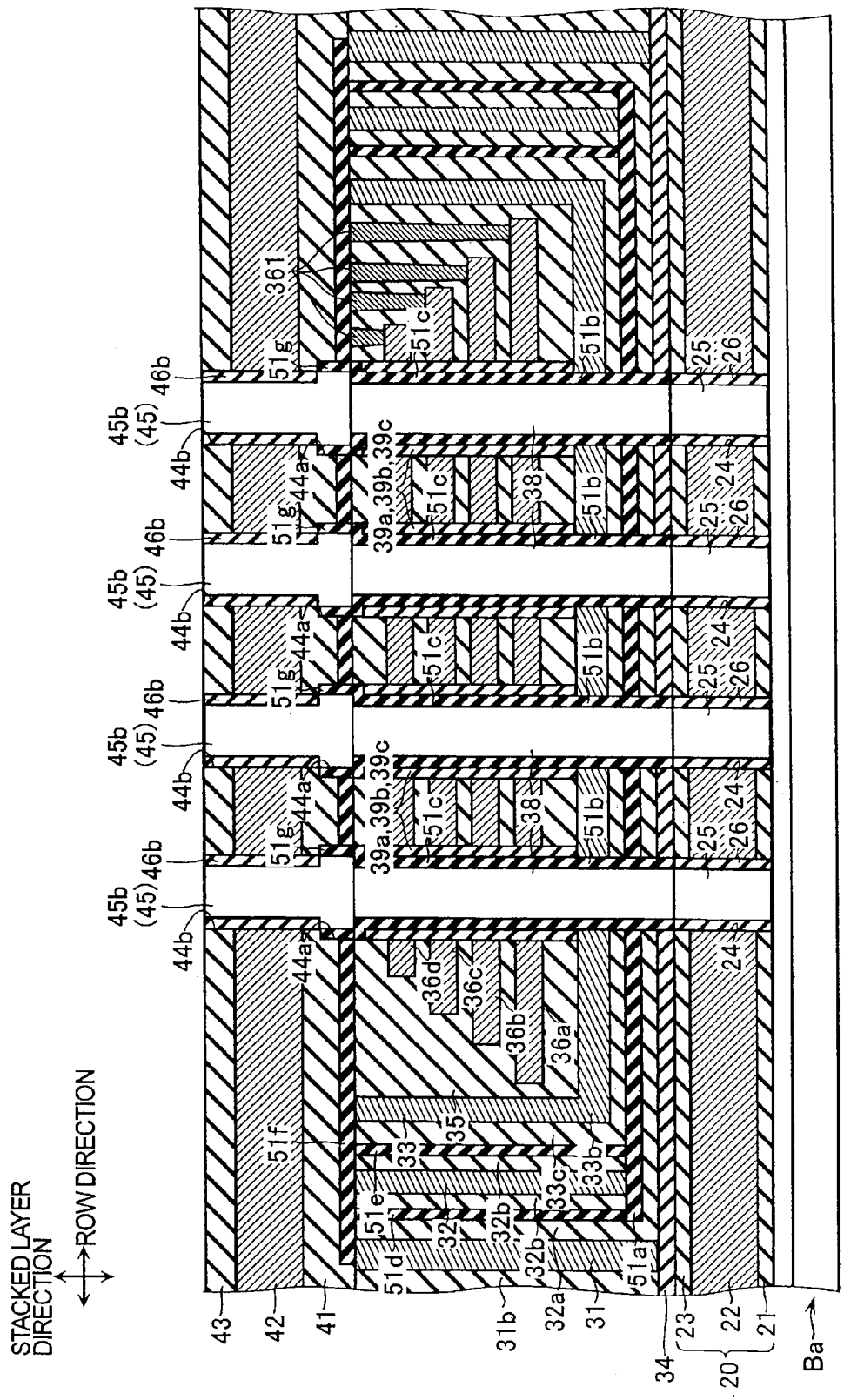
FIG. 25 is a cross-sectional schematic view showing the processing steps for fabricating the nonvolatile memory semiconductor device according to the first embodiment of the present invention.

As shown in FIG. 25, a silicon-oxide film and a silicon film are deposited on a sidewall of the second drain-side hole 44b in order to form the drain gate insulation layer 46 and the second drain-side columnar semiconductor layer 45b by subsequent etching. The drain-side columnar semiconductor layer 45 is constituted with the drain-side first columnar semiconductor layer 45a and the second drain-side columnar semiconductor layer 45b.

Figure 26:
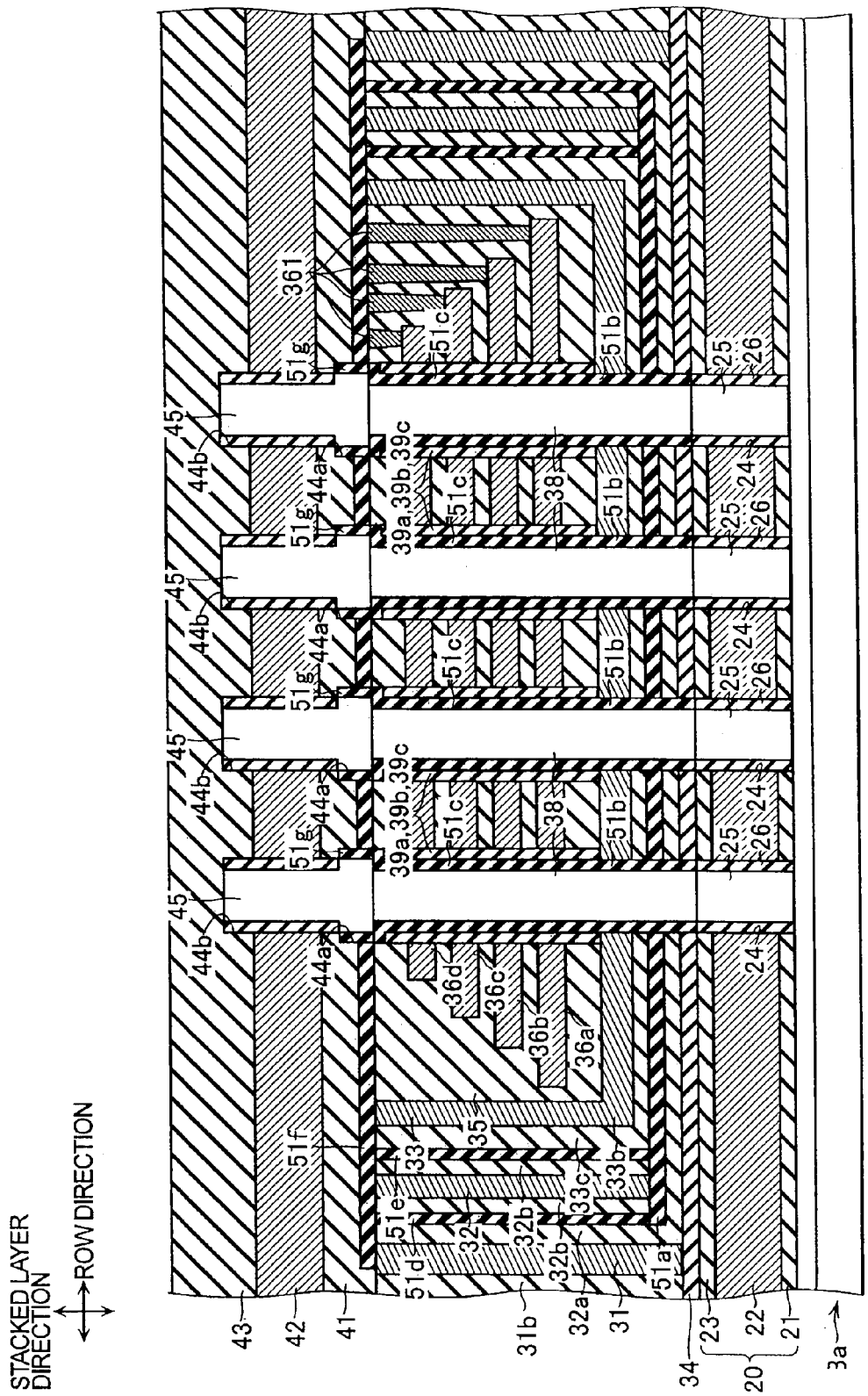
FIG. 26 is a cross-sectional schematic view showing the processing steps for fabricating the nonvolatile memory semiconductor device according to the first embodiment of the present invention.

As shown in FIG. 26, a SiO$_2$ film on the second drain-side insulation layer 43 to further form the second drain-side insulation layer 43 to be thickened.

Figure 27:
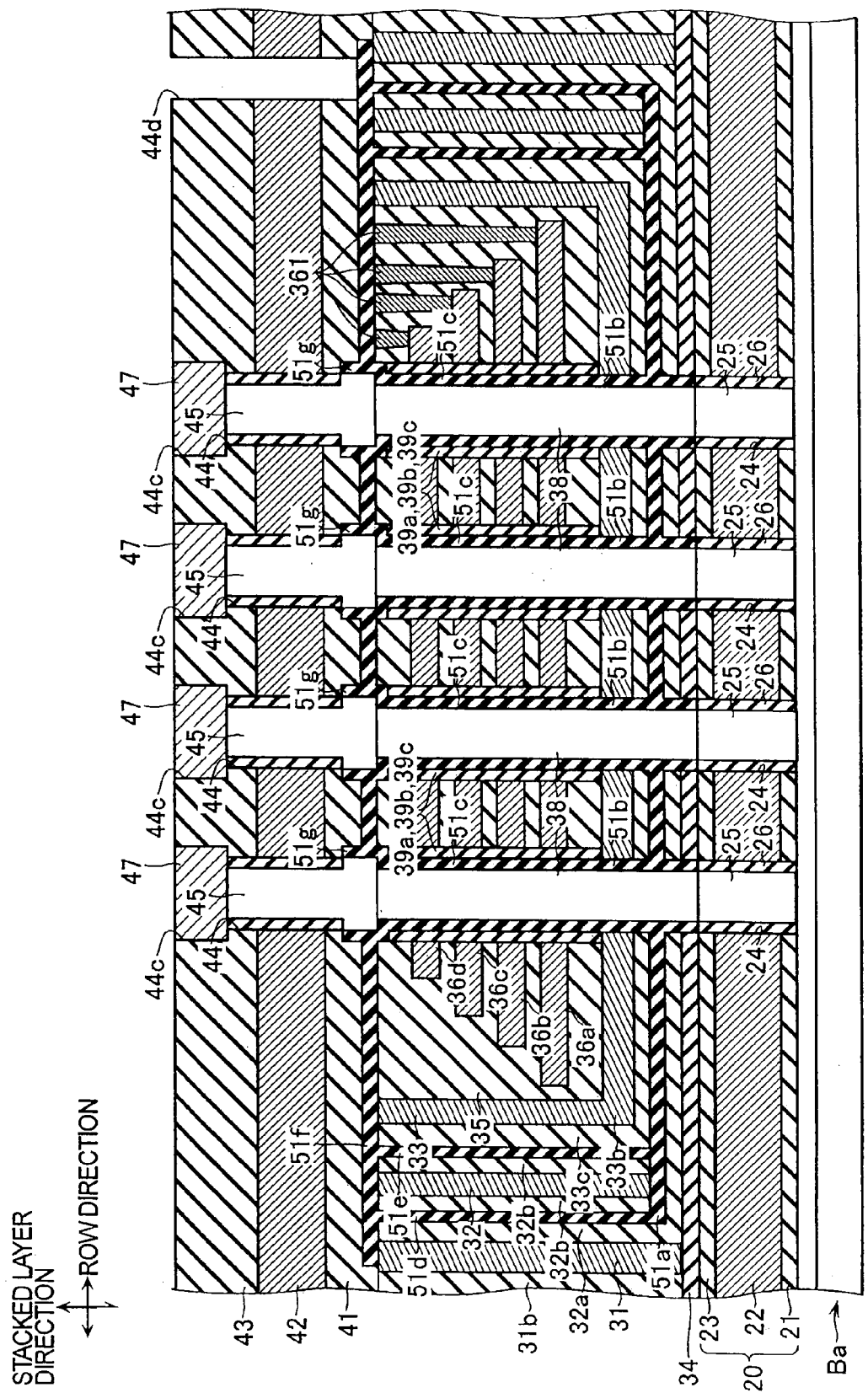
FIG. 27 is a cross-sectional schematic view showing the processing steps for fabricating the nonvolatile memory semiconductor device according to the first embodiment of the present invention.

As shown in FIG. 27, a bit line wiring groove 44c is formed at a portion being aligned with the drain-side hole 44 to pass through the second drain-side insulation layer 43. Further, a d third rain-side hole 44d is formed to pass through the drain-side second insulation layer 43, the drain-side conductive layer 42 and the first drain-side insulation layer 41 to a depth of the sixth sacrifice layer 51f. A poly-crystalline silicon film is deposited on the bit line wiring groove 44c to form the bit line layer 47.

After processing steps shown in FIG. 27, for example, the first-seventh sacrifice layers 51a-51g is removed in the drain-side third hole 44d by a vapor atmosphere of ClF$_3$, the structure of the nonvolatile semiconductor memory device 100 is formed as shown in FIG. 4. Here, the second space Ag2 is formed by removing the first sacrifice layer. The fourth space Ag4 is formed by removing the second sacrifice layer 51b and the third sacrifice layer 51c. The first space Ag1 is formed by removing the fourth sacrifice layer 51d. The third space Ag3 is formed by removing the fifth sacrifice layer 51e. The fifth space Ag5 is formed by removing the sixth sacrifice layer 51f and the seventh sacrifice layer 51g.

(Effect of the Nonvolatile Semiconductor Memory Device According to the First Embodiment)

Next, effects of the nonvolatile semiconductor memory device according to the first embodiment are explained. As mentioned above discussion, the nonvolatile semiconductor memory device according to the first embodiment has a capability of highly integrated structure. Further, the nonvolatile semiconductor memory device 100 having each layer of the memory cells MTrmn and the source-side selection transistors SSTrmn and each layer of the drain-side selection transistor SDTrmn can be fabricated by prescribed lithography processing steps without relations to a number of the layers on the word lines WL (word line conduction layer).

Further, the nonvolatile semiconductor memory device 100 is constituted to be written in data and read out data in a state where the first-fourth word line conduction layers 36a-36d are relatively moved to arbitrarily two-dimensional direction (the row direction and the column direction) corresponding to the memory 38. The nonvolatile semiconductor memory device 100 can execute writing in data and read out data at a plurality of portions on the charge storage layer 39b. Each of the portions is configured in the range of the row direction and the column direction. In other words, the nonvolatile semiconductor memory device 100 divides a part of the charge storage layer 39b on the circumference by the relative movement mentioned above to enlarge the memory density.

Further, as a relative movement distance of the charge storage layer 39b corresponding to the memory 38 is a maximum value of 10 nm, linearity control of the actuator is not necessary over a longer distance. Accordingly, the first actuator Ac1 and the second actuator Ac2 may be simple structures. As the structure can decrease a chip area occupied by the actuators and can lower a cost of the nonvolatile semiconductor memory device.

As mentioned above, the nonvolatile semiconductor memory device according to the first embodiment of the present invention has an effect of higher integration and lower cost on the nonvolatile semiconductor memory device.

Second Embodiment (A Specific Configuration of a Nonvolatile Semiconductor Memory Device According to a Second Embodiment)

Figure 28:
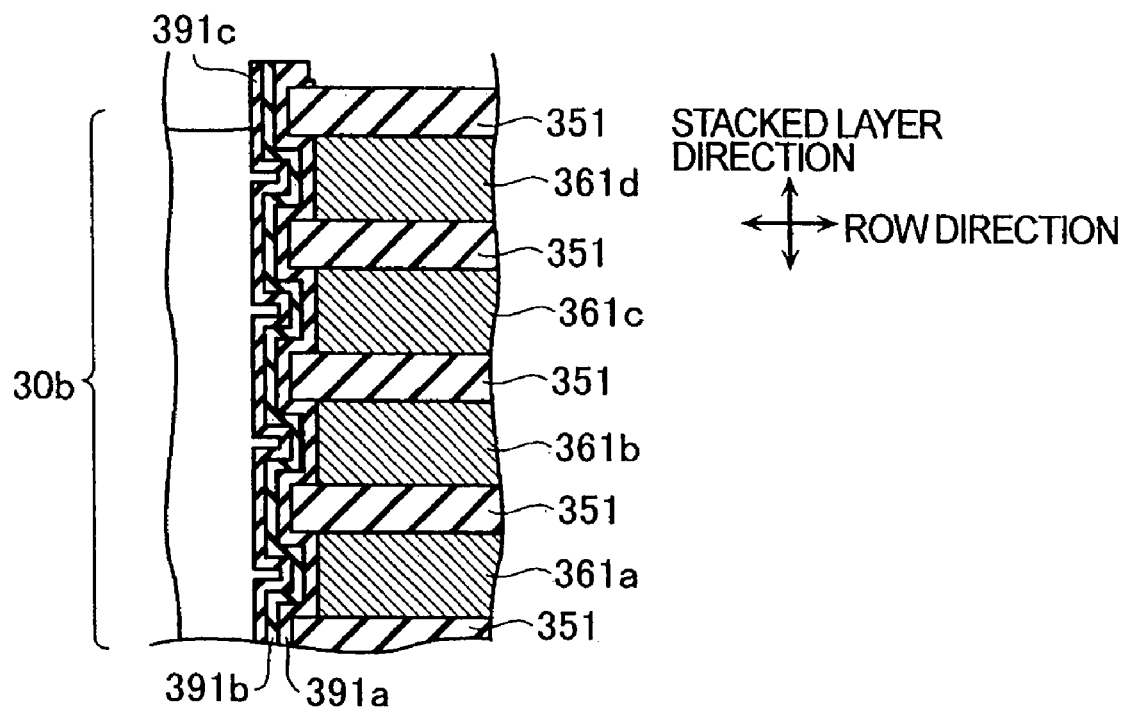
FIG. 28 is a partially enlarged cross-sectional schematic view showing a nonvolatile memory semiconductor device according to a second embodiment of the present invention.

Next, as reference to FIG. 28, a specific configuration of a nonvolatile semiconductor memory device according to a second embodiment is explained. FIG. 28 is a partially enlarged cross-sectional schematic view showing the nonvolatile memory semiconductor device according to the second embodiment. It is to be noted that the same or similar reference numerals in the second embodiment are applied to the same or similar parts and elements throughout the drawings as the first embodiment, and the description of the same or similar parts and elements will be omitted or simplified.

The nonvolatile semiconductor memory device according to the second embodiment has difference with a configuration of a memory layer 30b as compared to the memory layer 30 in the first embodiment.

The memory layer 30b is different from the memory layer 30 in the first embodiment. A sidewall of first-fourth word line conduction layers 361a-361d faced to the fourth space Ag4 are formed as recesses corresponding to a side wall of an interlayer insulator 351. Further, surfaces of a block insulation layer 391a, a charge storage layer 391b and a tunnel insulation layer 391c faced to the fourth space Ag4 (not illustrated) are formed as a concavo-convex shape accompanying with the first-fourth word line conduction layer 361a-361d.

(Effect of the Nonvolatile Semiconductor Memory Device According to the Second Embodiment)

Next, effects of the nonvolatile semiconductor memory device according to the second embodiment are explained. As mentioned above discussion, the nonvolatile semiconductor memory device according to the second embodiment has the same effects as the nonvolatile semiconductor memory device according to the first embodiment.

Further, the nonvolatile semiconductor memory device according to the second embodiment, the surfaces of the block insulation layer 391a, the charge storage layer 391b and the tunnel insulation layer 391c are formed as the concavo-convex shape. Thus, as compared to the first embodiment, a contact area between the first-fourth word line conduction layers 361a-361d and the memory 38 is decreased. Accordingly, continuing closely contact by excess electrostatic force between the first-fourth word line conduction layers 361a-361d and the memories 38 is suppressed to realize more stable relative-movement than the first embodiment.

Third Embodiment (A Specific Configuration of a Nonvolatile Semiconductor Memory Device According to a Third Embodiment)

Figure 29:
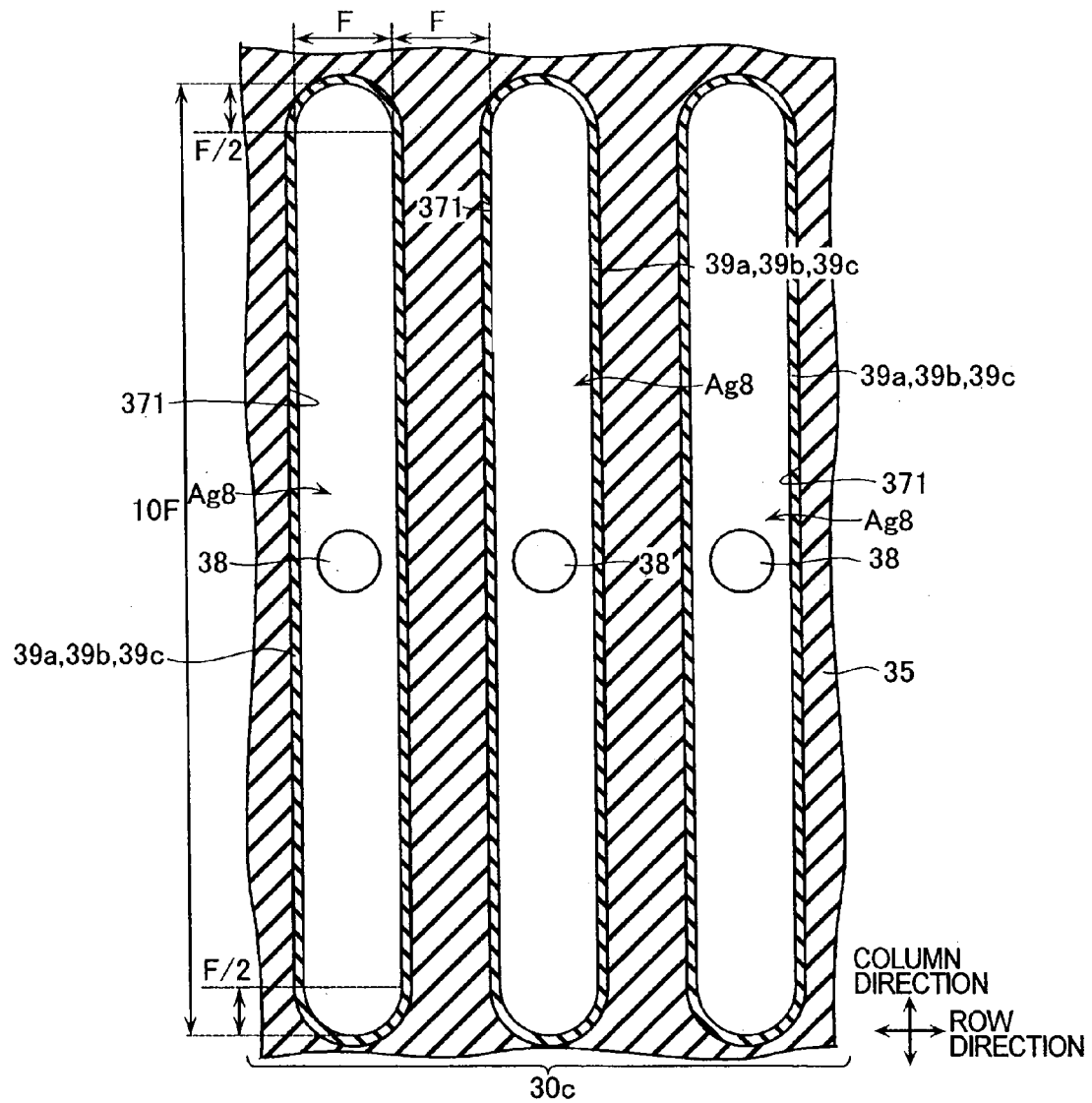
FIG. 29 is a part of a plain schematic view showing a memory layer of a nonvolatile memory semiconductor device according to a third embodiment of the present invention.

Next, as reference to FIG. 29, a specific configuration of a nonvolatile semiconductor memory device according to a third embodiment is explained. FIG. 29 is a part of plain schematic view showing a memory layer of the nonvolatile memory semiconductor device according to the third embodiment. It is to be noted that the same or similar reference numerals in the third embodiment are applied to the same or similar parts and elements throughout the drawings in the first embodiment, and the description of the same or similar parts and elements will be omitted or simplified.

The nonvolatile semiconductor memory device according to the third embodiment has difference with a configuration of a memory layer 30c as compared to the memory layer 30 in the first embodiment.

Figure 30:
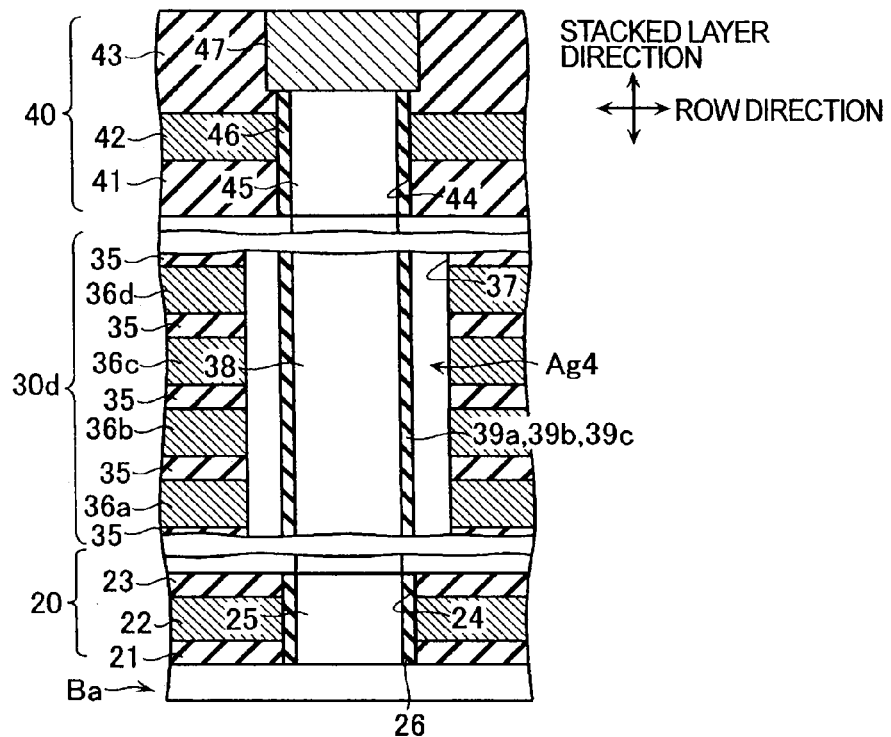
FIG. 30 is a part of a cross-sectional schematic view showing a nonvolatile memory semiconductor device according to a fourth embodiment of the present invention.

The memory layer 30c is different from the memory layer 30 in the first embodiment and has a memory hole 371. The memory hole 371, as same as the first embodiment, is configured in the first-fourth word line conduction layers 36a-36d as shown in FIG. 30. The memory hole 371 is formed like a slit which has the row-direction as lateral direction and the column direction as longitudinal direction from top view. Both ends of the row direction in the memory hole 371 are formed like a line. On the other hand, the column direction of the memory hole 371 is formed like a circular arc. As a result, an eighth space Ag8 is configured between a sidewall of the memory hole 371 and a sidewall of the memory 38. A perimeter length ratio R1 per unit area of the charge storage layer 39b faced to the memory hole 371 equals to $(18+\pi) F/20F^2$ and nearly equals to $1.06/F$, where, for example, a length in the row direction of the both end of the memory hole 371 is "F", a length in the column direction of the both end of the memory hole 371 is "10F", the nearest length of the neighbor memory holes 371 is "F" and the diameter of the circular arc in the both end of the memory hole 371 is "F". Further, the ratio R equals to $0.79/F$ in the first embodiment as mentioned above, thus, the ratio R1 of the nonvolatile semiconductor memory device according to the third embodiment is a higher value as compared to the ratio of the nonvolatile semiconductor memory device according to the first embodiment.

(Effect of the Nonvolatile Semiconductor Memory Device According to the Third Embodiment)

Next, effects of the nonvolatile semiconductor memory device according to the third embodiment are explained. As mentioned above discussion, the nonvolatile semiconductor memory device according to the third embodiment has the same effects as the nonvolatile semiconductor memory device according to the first embodiment.

Further, the perimeter length ratio R1 per unit area of the charge storage layer 39b faced to the memory hole 371 can be larger than the ratio in the first embodiment by the memory hole 371 of third embodiment. As the perimeter length of the charge storage layer for necessary to stably memorize one bit is constant, the nonvolatile semiconductor memory device in the third embodiment can lead to higher packing memory density than that in the first embodiment by enlarging the perimeter length.

Fourth Embodiment (A Specific Configuration of a Nonvolatile Semiconductor Memory Device According to a Fourth Embodiment)

Next, as reference to FIG. 30, a specific configuration of a nonvolatile semiconductor memory device according to a fourth embodiment is explained. FIG. 30 is a part of a cross-sectional schematic view showing the nonvolatile memory semiconductor device according to the fourth embodiment. It is to be noted that the same or similar reference numerals in the fourth embodiment are applied to the same or similar parts and elements throughout the drawings in the first embodiment, and the description of the same or similar parts and elements will be omitted or simplified.

The nonvolatile semiconductor memory device according to the fourth embodiment has difference with a configuration of a memory layer 30d as compared to the memory layer 30 in the first embodiment.

In the memory layer 30d, the tunnel insulation layer 39c, the charge storage layer 39b and the block insulation layer 39a are formed in order on a sidewall of the memory 38 instead of the sidewall of the memory hole 37 in the first embodiment.

(Effect of the Nonvolatile Semiconductor Memory Device According to the Fourth Embodiment)

Next, effects of the nonvolatile semiconductor memory device according to the fourth embodiment are explained. As mentioned above discussion, the nonvolatile semiconductor memory device according to the fourth embodiment has the same effects as the nonvolatile semiconductor memory device according to the first embodiment. Further, in the nonvolatile semiconductor memory device the fourth embodiment, the block insulation layer 39a is exposed to the fourth space Ag4. The tunnel insulation layer 39c has the thickness thereof being thinner than the thickness of the block insulation layer 39a and contacts with the memory 38. Accordingly, the tunnel insulation layer 39c is not damaged accompanying with driving the third frame layer 33 whereas the tunnel insulation layer 39c contacts with the memory 38. Hence, the nonvolatile semiconductor memory device according to the fourth embodiment can raise reliability as compared to that according the first embodiment.

Fifth Embodiment (A Specific Configuration of a Nonvolatile Semiconductor Memory Device According to a Fifth Embodiment)

Figure 31:
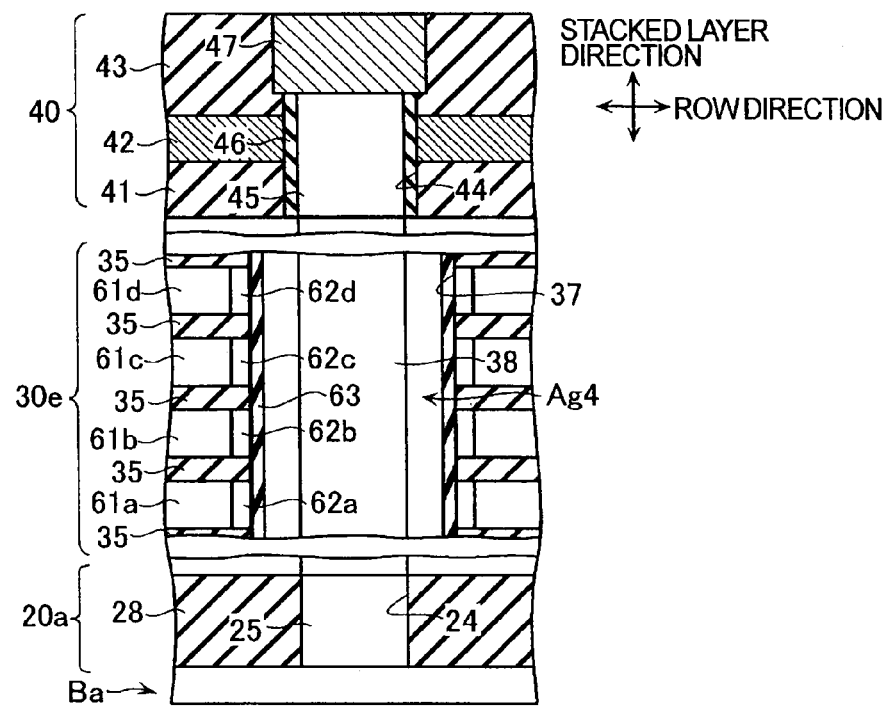
FIG. 31 is a part of a cross-sectional schematic view showing a nonvolatile memory semiconductor device according to a fifth embodiment of the present invention.

Next, as reference to FIG. 31, a specific configuration of a nonvolatile semiconductor memory device according to a fifth embodiment is explained. FIG. 31 is a part of a cross-sectional schematic view showing the nonvolatile memory semiconductor device according to the fifth embodiment. It is to be noted that the same or similar reference numerals in the third embodiment are applied to the same or similar parts and elements throughout the drawings in the first embodiment, and the description of the same or similar parts and elements will be omitted or simplified.

The nonvolatile semiconductor memory device according to the fifth embodiment has difference with a configuration of a source-side transistor layer 20a and a memory layer 30e as compared to the memory layer 30 in the first embodiment.

The source-side transistor layer 20a is different from that of the first embodiment. The source-side transistor layer 20a has not the source-side conductive layer 22, on the other hand, has a structure which source-side columnar semiconductor layer 25 is deposited in the source-side hole 24 formed on the source-side fourth insulation layer 28. In other word, the source-side selection transistors GS is not constituted with the source-side transistor layer 20a.

The memory layer 30e includes first-fourth p-type semiconductor layers 61a-61d instead of the first-fourth word line conduction layers 36a-36d. First-fourth n-type semiconductor layers 62a-62d is configured on a sidewall of the first-fourth p-type semiconductor layers 61a-61d at the memory hole 37 (fourth space Ag4) side. Further, a resistance-change layer 63 is formed to cover the first-fourth n-type semiconductor layers 62a-62d and the interlayer insulator 34 formed on a sidewall of the memory hole 37. The first-fourth p-type semiconductor layers 61a-61d and the first-fourth n-type semiconductor layers 62a-62d are formed of a poly-crystalline silicon film doped with impurities by plasma doping technique. The resistance-change layer 63 is constituted with titanium-oxide ($TiO_2$) or nickel-oxide (NiO).

Further, the resistance-change layer 63 may be constituted with silicon-nitride or silicon-dioxide. Moreover, the memory 38 is formed as an n-type semiconductor, the first-fourth p-type semiconductor layers 61a-61d is formed faced to the memory hole 37 (fourth space Ag4) and the first-fourth n-type semiconductor layers 62a-62d may be omitted. Furthermore, the memory 38 is formed as the p-type semiconductor, the first-fourth p-type semiconductor layers 62a-62d is formed as a plane and faced to the memory hole 37 (fourth space Ag4) and the first-fourth n-type semiconductor layers 61a-61d may be omitted.

Figure 32:
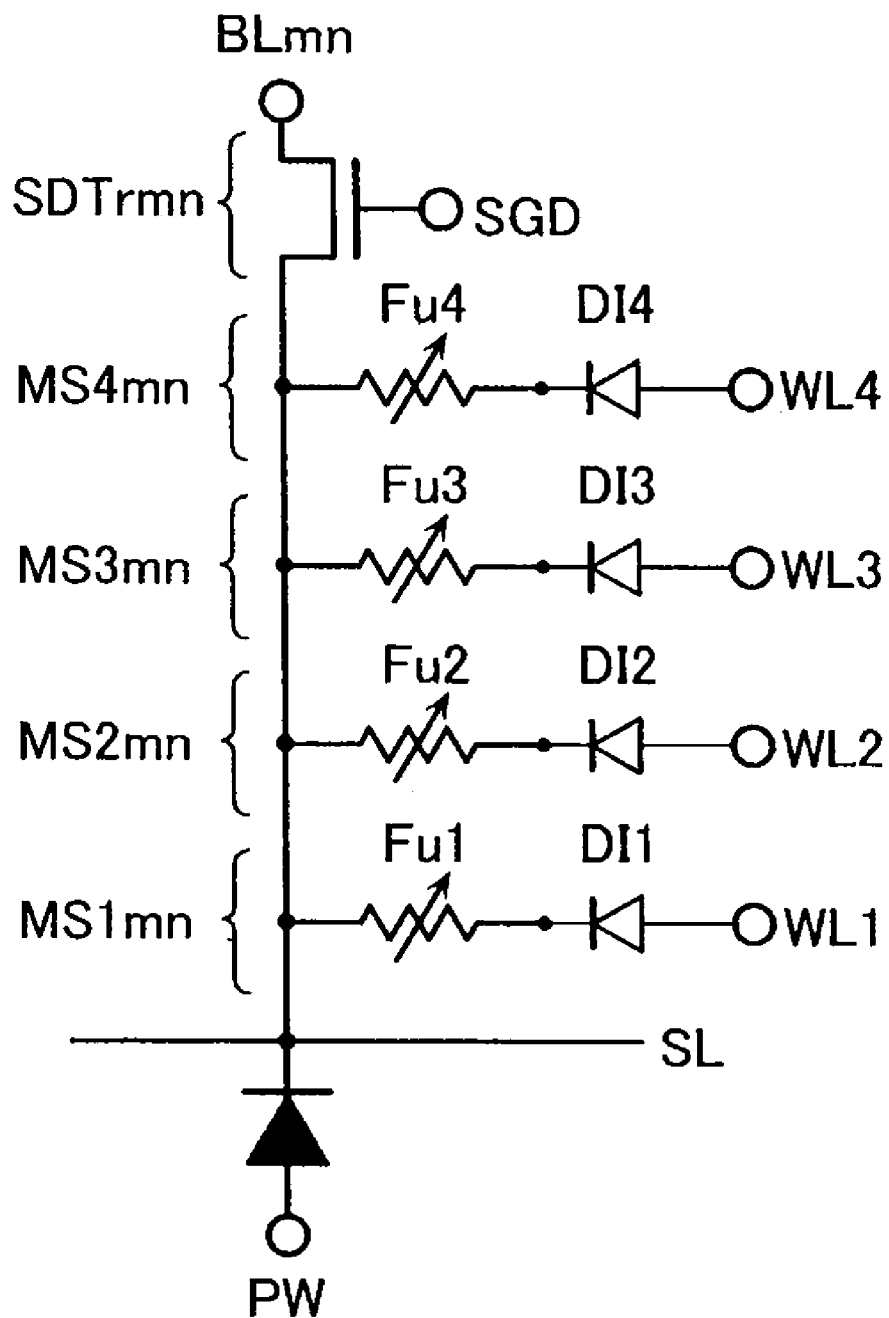
FIG. 32 is a circuit diagram showing a memory string of the nonvolatile memory semiconductor device according to the fifth embodiment of the present invention.

FIG. 32 is a circuit diagram showing a memory string of the nonvolatile memory semiconductor device according to the fifth embodiment. As shown in FIG. 32, in the nonvolatile semiconductor memory device according to the fifth embodiment, diodes DI1-DI4 are constituted with first-fourth p-type semiconductor layers 61a-61d and first-fourth n-type semiconductor layers 62a-62d. Further, the resistance-change layer 63 contacting with the first-fourth n-type semiconductor layers 62a-62d acts as the resistance-change elements Fu1-Fu4 serially contacting with diodes DI1-DI4. The nonvolatile semiconductor memory device according to the fifth embodiment is constituted with memory cells MS1mn-MS4mn being connected with the resistance-change elements Fu1-Fu4 and the diodes DI1-DI4. One end of the memory cell MS4mn is connected to one end of the drain-side selection transistor SDTrmn. The nonvolatile semiconductor memory device according to the fifth embodiment performs reading out, writing in and erasing data by controlling the resistance of the resistance-change layer 63 constituting resistance-change elements Fu1-Fu4 of the prescribed memory cells MS1mn-MS4mn.

(Effect of the Nonvolatile Semiconductor Memory Device According to the Fifth Embodiment)

Next, effects of the nonvolatile semiconductor memory device according to the fifth embodiment are explained. As mentioned above discussion, the nonvolatile semiconductor memory device according to the fifth embodiment has the same effects as the nonvolatile semiconductor memory device according to the first embodiment by using the resistance-change elements Fu1-Fu4 as the memory element.

Sixth Fifth Embodiment (A Specific Configuration of a Nonvolatile Semiconductor Memory Device According to a Sixth Embodiment)

Figure 33:
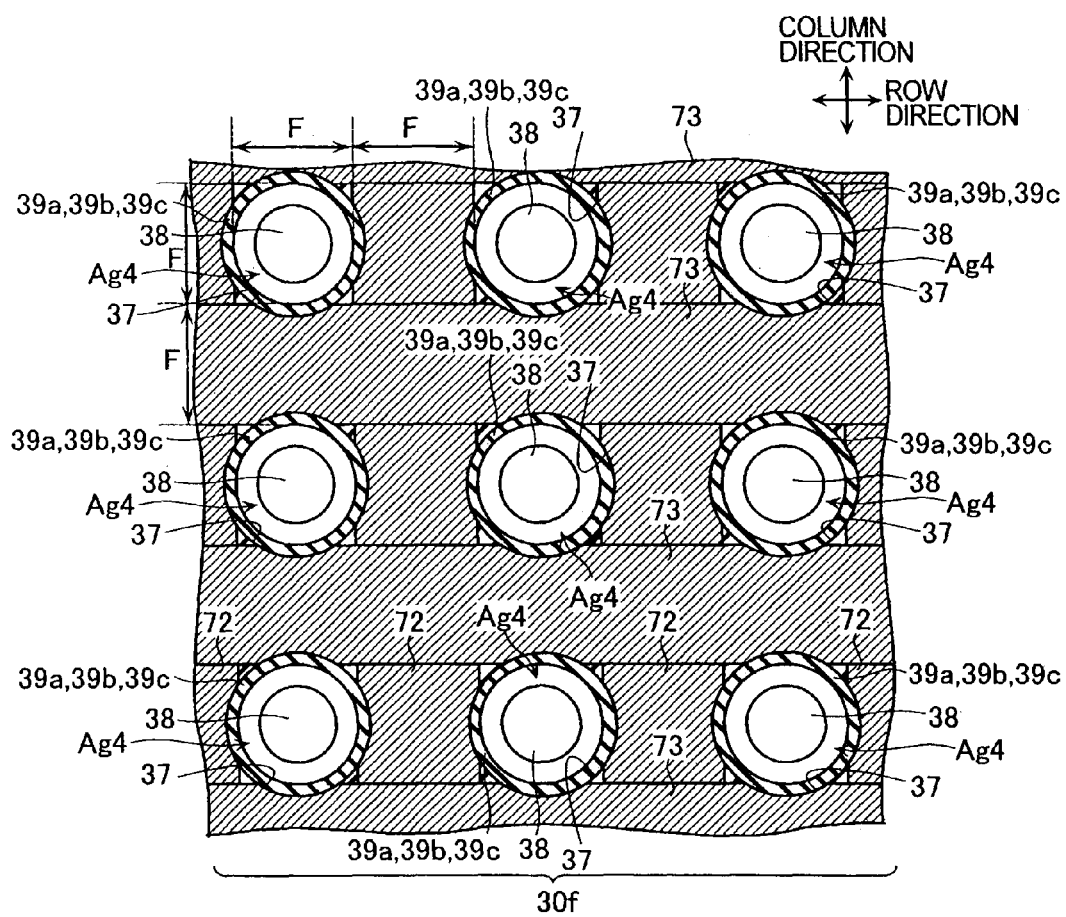
FIG. 33 is a part of a plain schematic view showing a nonvolatile memory semiconductor device according to a sixth embodiment of the present invention.
Figure 34:
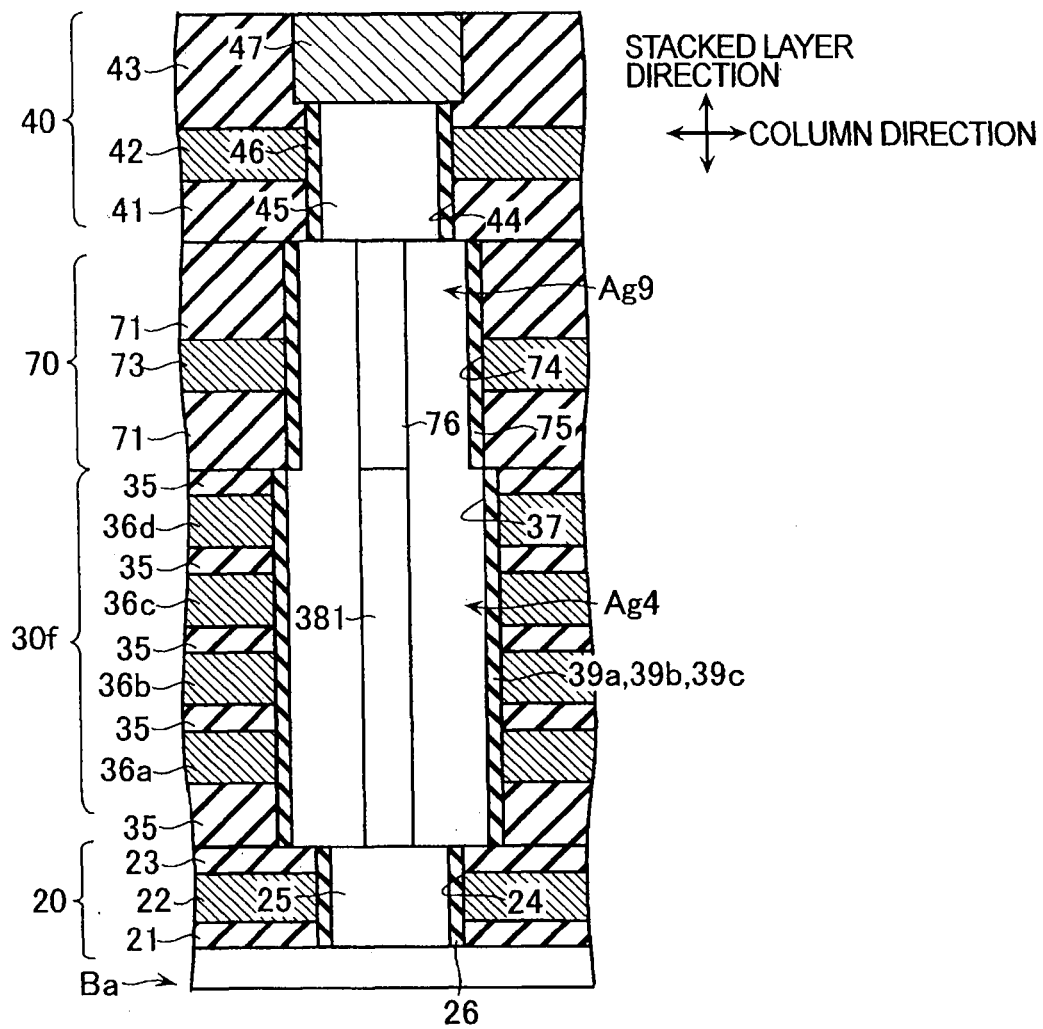
FIG. 34 is a part of a cross-sectional schematic view showing the nonvolatile memory semiconductor device according to the sixth embodiment of the present invention.
Figure 35:
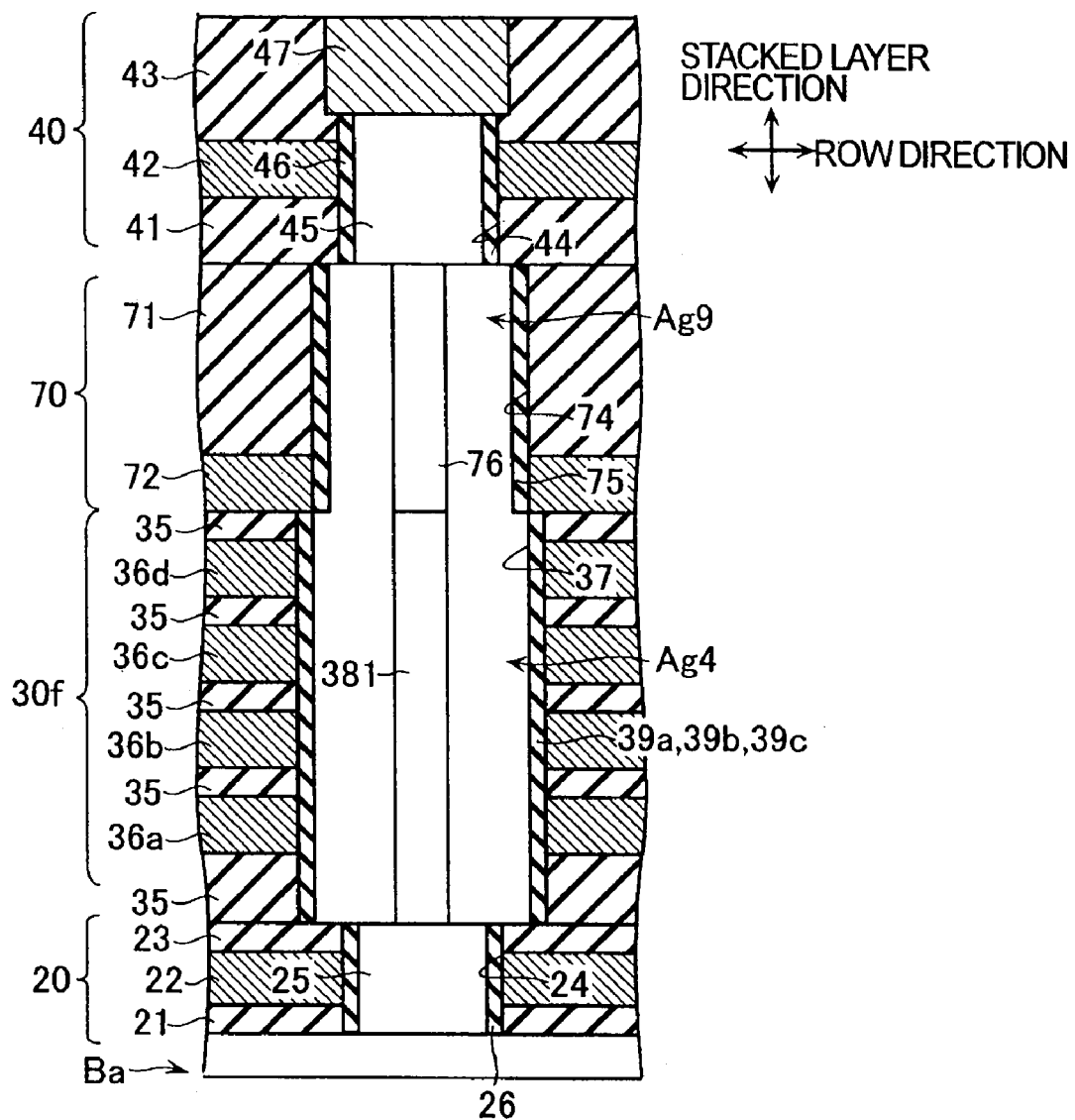
FIG. 35 is a part of a cross-sectional schematic view showing the nonvolatile memory semiconductor device according to the sixth embodiment of the present invention.

Next, as reference to FIGS. 33-35, a specific configuration of the nonvolatile semiconductor memory device according to the sixth embodiment is explained. FIG. 33 is a part of plain schematic view showing the nonvolatile memory semiconductor device according to the sixth embodiment. FIG. 34 is a part of a cross-sectional schematic view showing the nonvolatile memory semiconductor device according to the sixth embodiment. FIG. 35 is a part of a cross-sectional schematic view showing the nonvolatile memory semiconductor device. It is to be noted that the same or similar reference numerals in the sixth embodiment are applied to the same or similar parts and elements throughout the drawings in the first embodiment, and the description of the same or similar parts and elements will be omitted or simplified.

As shown in FIGS. 33-35, the nonvolatile semiconductor memory device according to the sixth embodiment has difference to a configuration of a memory layer 30f as compared to the memory layer 30 in the first embodiment. Further, the nonvolatile memory semiconductor device according to the sixth embodiment includes an electrostatic layer 70 at upper portion (drain-side transistor layer 40) of the memory layer 30f.

As compared to the nonvolatile semiconductor memory device according the first embodiment, the first space Ag1, the second space Ag2, the third space Ag3, the fifth space Ag5, the first-third frame layers 31-33 and the third frame bottom layer 33b are not formed in the memory layer 30f, instead, the interlayer insulator is formed in the memory layer 30f. Thus, in the nonvolatile semiconductor memory device according to the sixth embodiment, the memory layer 30f does not include the first actuator Ac1 and the second actuator Ac2 which are included in the first-fifth embodiments as mentioned above. The memory layer 30f is fixed to the source-side transistor layer 20 and the drain-side transistor layer 40. Further, the memory layer 30f includes a memory 381 with flexibility. The memory 381 according to the sixth embodiment has a smaller diameter than that of the first embodiment. Moreover, the memory 381 is constituted with a single-crystalline silicon film epitaxially grown or a germanium-silicon film. The memory 381 has flexibility by the structure mentioned above. The memory 381 may be constituted with another semiconductor with flexibility, for example, a carbon nano-tube with semiconductor properties or the like.

The electrostatic layer 70 includes a lower wiring layer 72 (as shown in FIG. 35) and an upper wiring layer 73 (as shown in FIG. 34) above the memory layer 30f via an interlayer insulator 71. Moreover, the electrostatic layer 70 is formed to contact the drain-side first insulation layer 41 above the most upper portion of the interlayer insulator 71. The lower wiring layer 72 is formed as a stripe configured by a prescribed pitch in the row-direction and extended in the column direction as shown in FIG. 33. The upper wiring layer 73 is positioned upper layer than the lower wiring layer 72 as clearly shown in FIG. 33 and FIG. 35 and is formed as a stripe configured by a prescribed pitch in the column direction and extended in the row-direction. An electrostatic hole 74 is formed at a portion to align with the memory hole 37 in the electrostatic layer 70. The electrostatic hole 74 is a smaller diameter than a diameter of the memory hole 37. A sidewall insulation layer 75 made of poly-crystalline silicon is formed on a sidewall of the electrostatic hole 74. Further, an electrostatic columnar semiconductor layer 76 is formed at an upper portion of the memory 381. The electrostatic columnar semiconductor layer 76 is configured to form a ninth space Ag9 between the electrostatic columnar semiconductor layer 76 and the sidewall insulation layer 75. The electrostatic columnar semiconductor layer 76 has a diameter which nearly equal to a diameter of the memory 381. The drain-side columnar semiconductor layer 45 is connected to the upper surface of the electrostatic columnar semiconductor layer 76. The electrostatic columnar semiconductor layer 76 is constituted with a silicon single-crystalline film epitaxially grown or germanium-silicon (SiGe) film. The electrostatic layer 70 has a function deforming the memory 381 to a prescribed direction corresponding to the electrostatic columnar semiconductor layer 76 and the memory 381 by using electrostatic force.

(A Mechanism of the Nonvolatile Semiconductor Memory Device According to the Sixth Embodiment)

Figure 36:
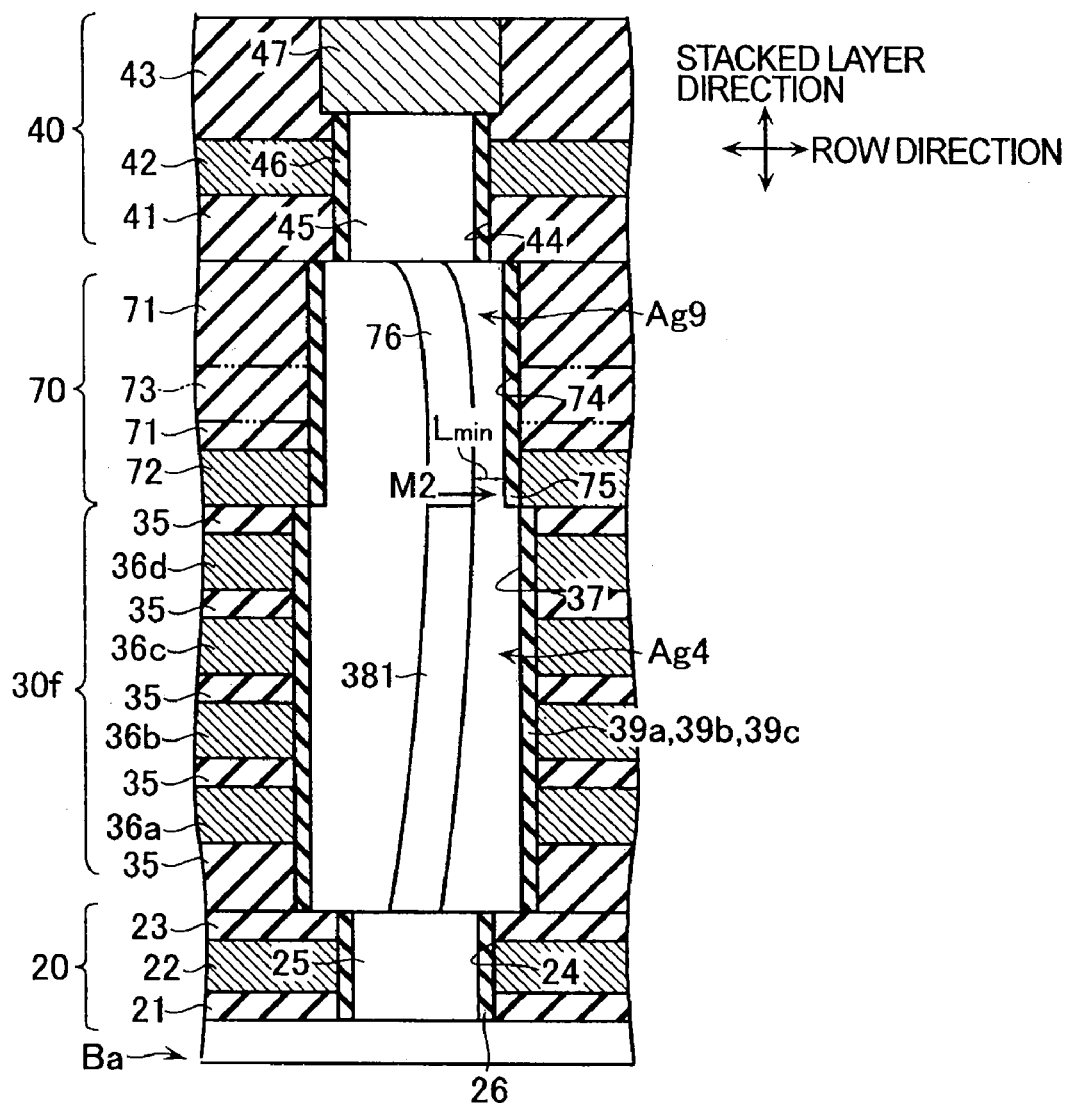
FIG. 36 is a cross-sectional schematic view showing a mechanism of the nonvolatile memory semiconductor device according to the sixth embodiment of the present invention.

Next, as reference to FIG. 36, a mechanism of the nonvolatile semiconductor memory device according to the sixth embodiment is explained. As shown in FIG. 36, in the nonvolatile semiconductor memory device according to the sixth embodiment, electric field is generated on the sidewall insulation layer 75 by applying voltage to the lower wiring layer 72 and the upper wiring layer 73. Electrostatic force is generated between a sidewall of the electrostatic columnar semiconductor layer 76 and a sidewall of the opposite sidewall insulation layer 75 by the voltage. Namely, a memory 381 (electrostatic columnar semiconductor layer 76) is bended to prescribed row direction and column direction which is shown as an arrow M2 in FIG. 36 by electrostatic force accompanying with applied voltage between the lower wiring layer 72 and the upper wiring layer 73. A distance between the column direction electrostatic columnar semiconductor layer 76 and the sidewall insulation layer 75, and another distance between the memory 381 and the tunnel insulation layer 39c relatively becomes the shortest distance $L_{min}$ as compared to other positions in the row direction and the column direction.

Successively applying voltage to the electrostatic layer 70, voltage is applied to the word line being connected to memory cells for reading out and writing in. Here, the word line is set to the fourth word line conduction layer 36d. As the distance between the memory 381 and the tunnel insulation layer 39c is the shortest distance $L_{min}$, the memory 381 is further bended to the prescribed row direction and column direction constituting the shortest distance $L_{min}'$. Successively, voltage is applied to a third word line conduction layer 36c, a second word line conduction layer 36b and a first word line conduction layer 36a as same as a fourth word line conduction layer 36d. The memory 381 (electrostatic columnar semiconductor layer 76) is bended to the prescribed row direction and column direction. By behavior mentioned above, the whole memory 381 is moved to the prescribed row direction and column direction. As shown in FIG. 36, the charges in the charge storage layer 39b are controlled to perform writing in data, erasing data and reading out data in a state which the memory 381 is bended.

(Effect of the Nonvolatile Semiconductor Memory Device According to the Sixth Embodiment)

Next, effects of the nonvolatile semiconductor memory device according to the sixth embodiment are explained. As mentioned above discussion, the nonvolatile semiconductor memory device according to the sixth embodiment has the same effects as the nonvolatile semiconductor memory device according to the first embodiment. Further, the first actuator Ac1 and the second actuator Ac2 like as the first-fifth embodiments are not necessary in the nonvolatile semiconductor memory device according to the sixth embodiment. As the nonvolatile semiconductor memory device according to the sixth embodiment can be omitted the first-third frame layers 31-33 to be able to further highly integrate as compared to the first embodiment-fifth the embodiments.

Moreover, in the nonvolatile semiconductor memory device according to sixth the embodiment, each of the memories 381 can be bended by driving specific lower wiring layer 72 and upper wiring layer 73. As a result, a problem of contact faulty between the memory 381 and the charge storage layer 39b can be suppressed. The faulty may be generated in a state, for example, which the memory 381 fully cannot approach to the charge storage layer 39b or the memory 381 is pressed to the charge storage layer 39b by excess forth. Further, the nonvolatile semiconductor memory device without the actuator and the frame layer according to the sixth embodiment can realize lower cost as compared to the first-fifth embodiments.

Further, in the nonvolatile semiconductor memory device according to the sixth embodiment, the memory 381 and the electrostatic columnar semiconductor layer 76 is constituted with a silicon single-crystalline film epitaxially grown or a germanium-silicon (SiGe) film. By the constitution, the memory 381 and the electrostatic columnar semiconductor layer 76 is formed to have comparatively uniform mechanical characteristics as compared to a constitution by a poly-crystalline body such as poly-crystalline silicon. Accordingly, the electrostatic layer 70 is driven as a lower voltage and the memories in the columnar semiconductor layer 381 and the electrostatic columnar semiconductor layer 76 are bended by high reliability.

Seventh Embodiment (A Specific Configuration of a Nonvolatile Semiconductor Memory Device According to a Seventh Embodiment)

Figure 37:
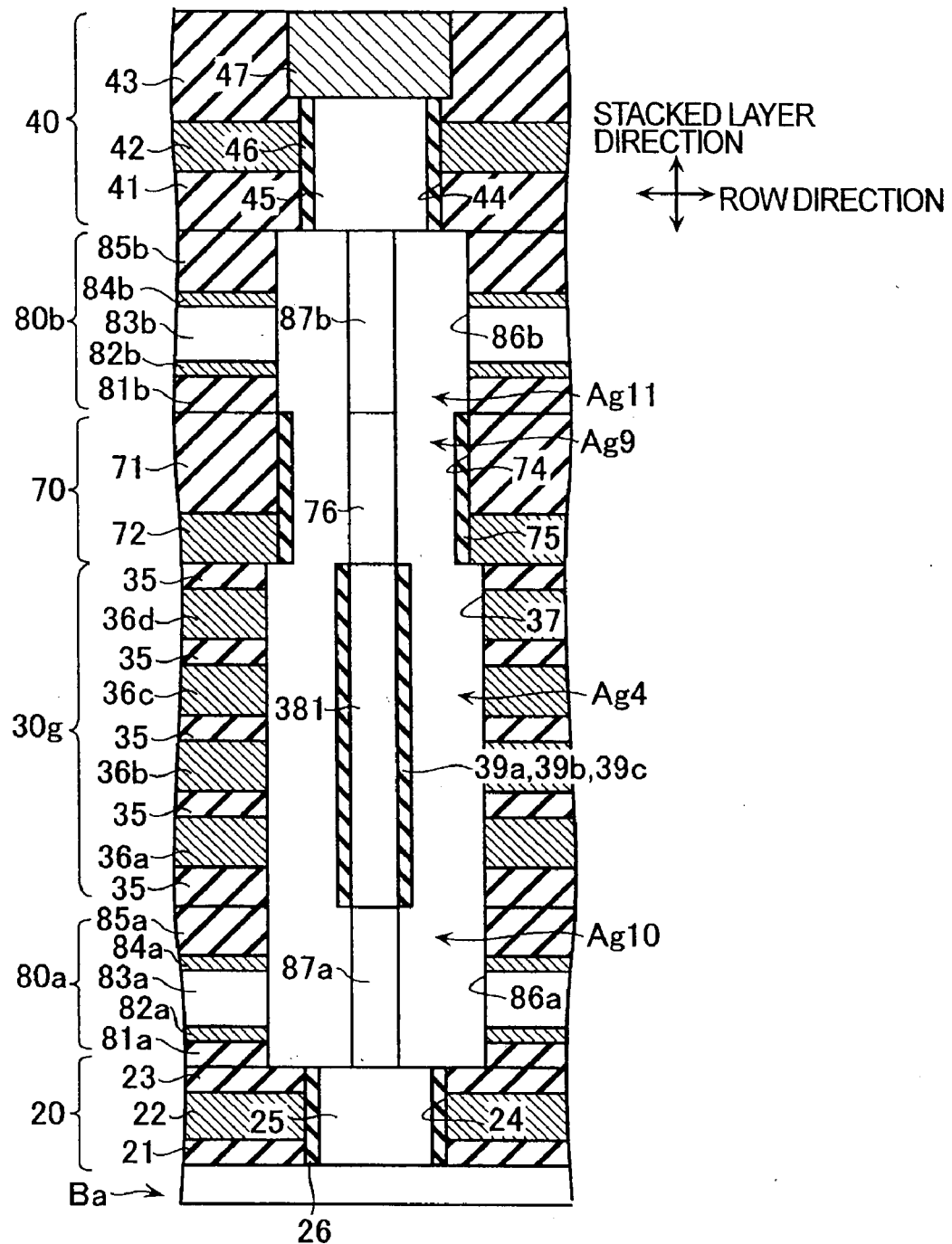
FIG. 37 is a part of a cross-sectional schematic view showing a nonvolatile memory semiconductor device according to a seventh embodiment of the present invention.

Next, as reference to FIG. 37, a specific configuration of a nonvolatile semiconductor memory device according to a seventh embodiment is explained. FIG. 37 is a part of a cross-sectional schematic view showing the nonvolatile memory semiconductor device according to the seventh embodiment. It is to be noted that the same or similar reference numerals in the seventh embodiment are applied to the same or similar parts and elements throughout the drawings in the first embodiment, and the description of the same or similar parts and elements will be omitted or simplified.

As shown in FIG. 37, the nonvolatile semiconductor memory device according to the seventh embodiment has difference with a configuration of a memory layer $30g$ as compared to the memory layer 30 in the first embodiment. Further, the nonvolatile semiconductor memory device according to the seventh embodiment includes a lower driving layer $80a$ and an upper driving layer $80b$ in addition to the constitution of the sixth embodiment. The lower driving layer $80a$ is formed between the source-side transistor layer 20 and a memory layer $30g$. The upper driving layer $80b$ is formed between the electrostatic layer 70 and the drain-side transistor layer 40.

The memory layer $30g$ in which a tunnel insulation layer $39c$, a charge storage layer $39b$ and a block insulation layer $39a$ are stacked in order is formed on a sidewall of the memory 381, on the other hand, the memory layer is formed on the memory hole 37 in the sixth embodiment.

The lower driving layer $80a$ has an lower first insulation layer $81a$, an lower first electrode layer $82a$, a piezo element film $83a$, a lower second electrode layer $84a$ and an lower second insulation layer $85a$ which are stacked on the source-side second insulation layer 23 in order. The lower second insulation layer $85a$ is formed to contact with the lowest interlayer insulator 35 in the memory layer $30f$. The lower first electrode layer $82a$ and lower second electrode layer $84a$ are constituted with, for example, an Al film or a TiN film. The piezo element film $83a$ is constituted with, for example, (Pb, Zr)TiO3 or AlN.

A lower driving hole $86a$ is formed at a portion aligned with the source-side hole 24 in the lower driving layer $80a$ to pass through the lower second insulation layer $85a$, the lower second electrode layer $84a$, the piezo element film $83a$, the lower first electrode layer $82a$ and the lower first insulation layer $81a$. A lower columnar semiconductor layer $87a$ is formed in the lower driving hole $86a$. The lower columnar semiconductor layer $87a$ has the same diameter as that of the memory 381. An under surface of the lower columnar semiconductor layer $87a$ is formed to contact with an upper surface of the source-side columnar semiconductor layer 25. An upper surface of the lower columnar semiconductor layer $87a$ is formed to contact with an under surface of the memory 381. Further, a tenth space Ag10 is formed between a sidewall of the lower driving hole $86a$ and a sidewall of the lower columnar semiconductor layer $87a$.

The upper driving layer $80b$ includes an upper first insulation layer $81b$, an upper first electrode layer $82b$, a piezo element film $83b$, an upper second electrode layer $84b$, and an upper second insulation layer $85b$ which are stacked on the electrostatic layer 70 in order. The upper second insulation layer $85b$ is formed to contact to a lower portion of the drain-side first insulation layer 41. The upper first electrode layer $82b$ and the upper second electrode layer $84b$ are constituted with, for example, an Al film or a TiN film. The piezo element film $83b$, for example, is constituted with (Pb, Zr)TiO3 or AlN.

Further, an upper driving hole $86b$ is formed at a portion aligned with the electrostatic hole 74 in the upper driving layer $80b$ to pass through the upper second insulation layer $85b$, the upper second electrode layer $84b$, the piezo element film $83b$, the upper first electrode layer $82b$, and the upper first insulation layer $81b$. The upper columnar semiconductor layer $87b$ is formed in the upper driving hole $86b$. The upper columnar semiconductor layer $87b$ has the same diameter as that of the electrostatic columnar semiconductor layer 76. An under surface of the upper columnar semiconductor layer $87b$ is formed to contact with an upper surface of the electrostatic columnar semiconductor layer 76. An upper surface of the upper columnar semiconductor layer $87b$ is formed to contact with an under surface of the drain columnar semiconductor layer 45. Further, an eleventh space Ag11 is formed between a sidewall of the upper driving hole $86b$ and a sidewall of the upper columnar semiconductor layer 87.

(A Mechanism of the Nonvolatile Semiconductor Memory Device According to the Seventh Embodiment)

Figure 38:
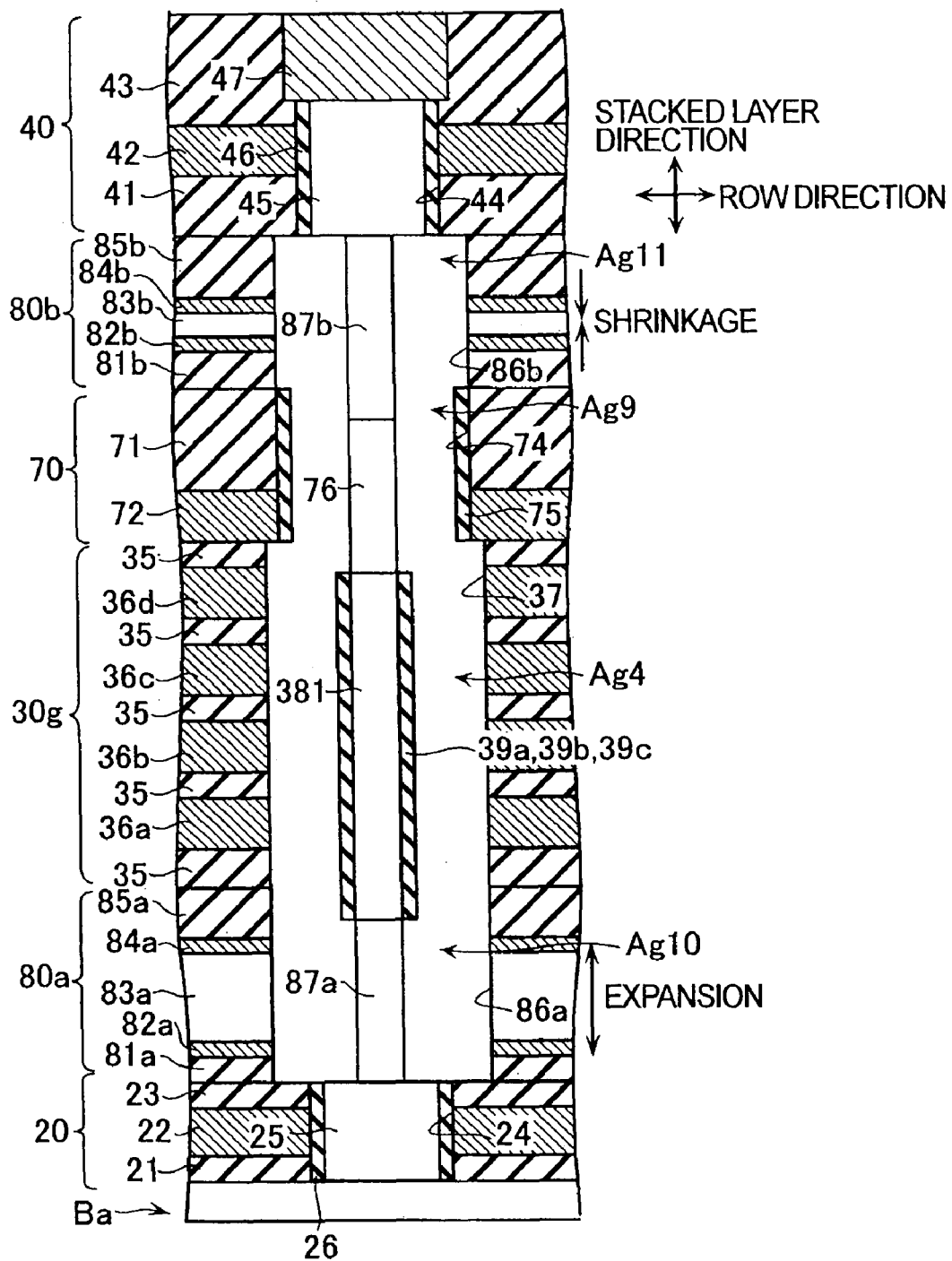
FIG. 38 is a cross-sectional schematic view showing a mechanism of the nonvolatile memory semiconductor device according to the seventh embodiment of the present invention.
Figure 39:
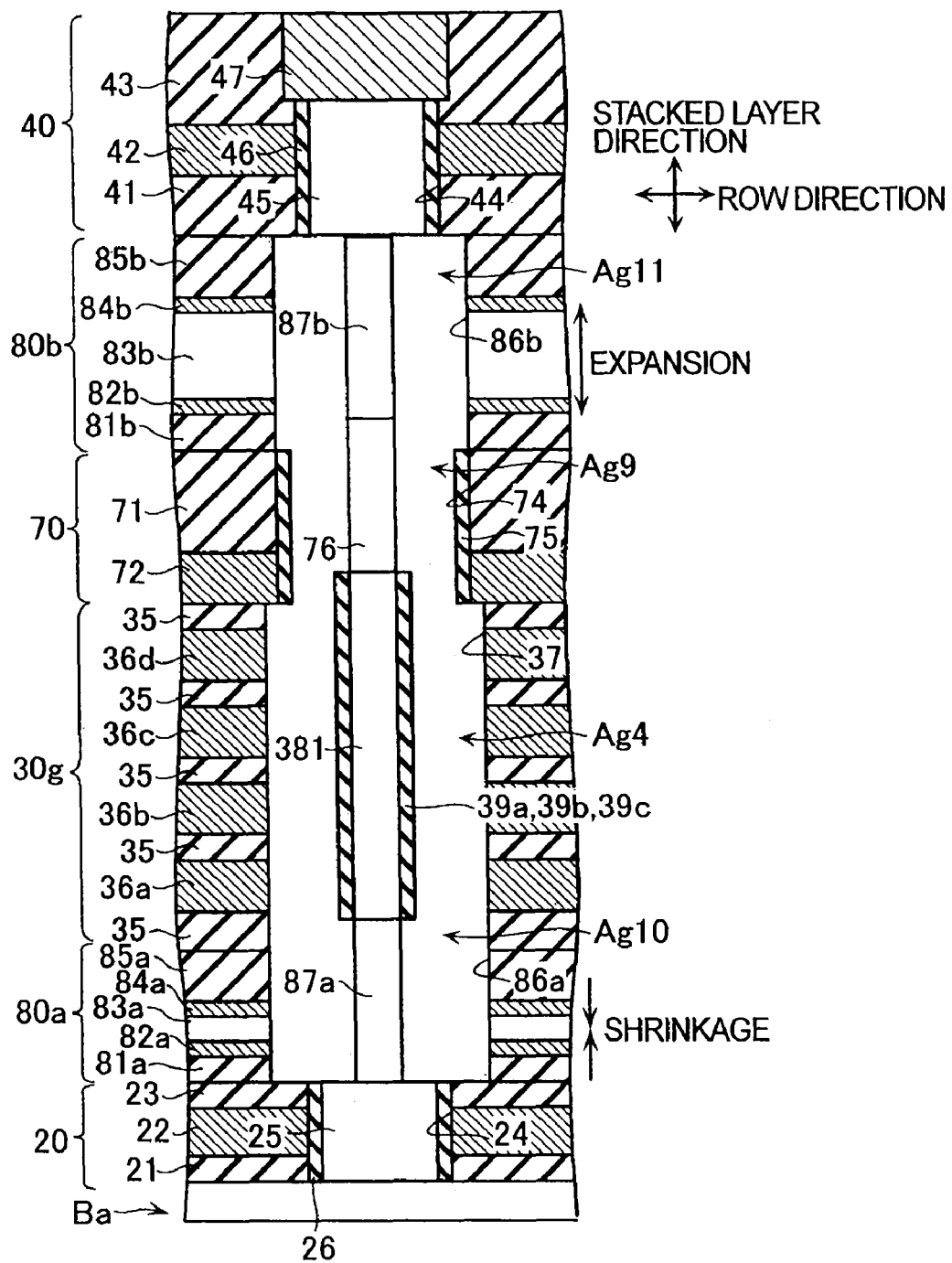
FIG. 39 is a cross-sectional schematic view showing the mechanism of the nonvolatile memory semiconductor device according to the seventh embodiment of the present invention.

Next, as reference to FIG. 38 and FIG. 39, a mechanism of the nonvolatile semiconductor memory device according to the seventh embodiment is explained. As shown in FIG. 38, piezo element film $83a$ is expanded by applying a prescribed voltage to the lower first electrode $82a$ and the lower second electrode $84a$. On the other hand, the piezo element film $83b$ is shrinked by applying a prescribed voltage to the upper first electrode $82b$ and the upper second electrode $84b$ as shown in FIG. 38. In this way, the word line conduction layers from the first word line conduction layer $36a$ to the fourth word line conduction layer $36d$ relatively move to upper side corresponding to the charge storage layer $39b$ and the memory.

As shown in FIG. 39, the piezo element film $83a$ is shrinked by applying a prescribed voltage to the upper first electrode $82a$ and the upper second electrode $84a$; on the other hand, piezo element film $83b$ is expanded by applying a prescribed voltage to the upper first electrode $82b$ and the upper second electrode $84b$. In this way, the word line conduction layers from the first word line conduction layer $36a$ to the fourth word line conduction layer $36d$ relatively moved to lower side corresponding to the charge storage layer $39b$ and the memory 381.

As shown in FIG. 38 or FIG. 39 mentioned above, the word line conduction layers from the first word line conduction layer $36a$ to the fourth word line conduction layer $36d$ are moved to lower side and upper side corresponding to the memory 381, successively the memory 381 is bended as the same as the sixth embodiment. Namely, the word line conduction layers from the first word line conduction layer $36a$ to the fourth word line conduction layer $36d$ relatively move to the row-direction, the column direction, and the stacking direction corresponding to the charge storage layer $39b$. Further, when the first-fourth word line conduction layers $36a$-$36d$ are applied voltage, data are performed to be read out and to be written in the portion of the charge storage layer $39b$ approach to the first-fourth word line conduction layers $36a$-$36d$. Writing in data and reading out data are performed in a plurality of positions of the charge storage layer $39b$ around the memory hole 37 (fourth space Ag4) by changing the movement direction of the first-fourth word line conduction layers $36a$-$36d$ and the bending direction of the memory 381. The positions can be set at the row direction, the column direction and the stacking direction.

(Effect of the Nonvolatile Semiconductor Memory Device According to the Seventh Embodiment)

Next, effects of the nonvolatile semiconductor memory device according to the seventh embodiment are explained. As mentioned above discussion, the nonvolatile semiconductor memory device according to the seventh embodiment has the same effects as the nonvolatile semiconductor memory device according to the first embodiment. In the nonvolatile semiconductor memory device according to the seventh embodiment, the first-fourth word line conduction layers 36a-36d have capability of relative movement to upper and lower direction in addition to the row direction and the column direction corresponding to charge storage layer 39b. In this way, in the nonvolatile semiconductor memory device according to the seventh embodiment, writing in data and reading out data can be performed in the plurality of the positions of the charge storage layer 39b. The positions can be set at the row-direction, the column direction and the stacking direction. The nonvolatile semiconductor according to the seventh embodiment memory device has a higher memory density by relative movement to upper and lower direction of the first-fourth word line conduction layers 36a-36d as compared to the sixth embodiment.

Other Embodiments

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the claims that follow. The invention can be carried out by being variously modified within a range not deviated from the gist of the invention.

For example, in the first-seventh embodiments, word lines WL (first-fourth word line conduction layer 36a-36d) are explained as a plane structure, however, the word lines WL are not limited as the plane structure. The word lines WL, for example, may be a stripe structure.

Further, in the first-seventh the embodiments, the memory layers is constituted with a stacked layer of the tunnel insulation layer (Oxide), the charge storage layer (Nitride) and the block insulation layer (Oxide) in order from the memory side, which is an ONO structure, however, an NO structure omitted the tunnel insulation layer (Oxide) may be applicable.

Further, in the sixth and seventh the embodiments, the memory layer 30e of the fifth embodiment can be applicable in stead of the memory layers 30f, 30g.

Further, in the sixth and seventh the embodiment, an space and an actuator is configured to relatively move the first-fourth word line conduction layers 36a-36d to the row-direction and the column direction, so that the first-fourth word line conduction layers 36a-36d can be moved to the row direction and the column direction.

What is claimed is:

1. A nonvolatile semiconductor memory device, comprising a plurality of memory strings, each having a plurality of serially connected electrically erasable memory cells, the memory strings comprising:
   a columnar semiconductor layer perpendicularly extending to a substrate;
   a plurality of conductive layers being formed in parallel with the substrate and including a first space between sidewalls of the columnar semiconductor layers; and
   a physical characteristic change layer being formed on the sidewall of the columnar semiconductor layer facing the first space or a sidewall of the conductive layer facing the first space, the characteristic change layer changing characteristics in relation to an applied voltage;
   wherein each of the conductive layers is configured to shift in a direction parallel to the substrate while the columnar semiconductor layer remains non-movably fixed to the substrate.

2. The nonvolatile semiconductor memory device according to claim 1,
   wherein a surface of the physical characteristic change layer facing the first space has concavity and convexity.

3. The nonvolatile semiconductor memory device according to claim 1,
   wherein the first space is configured in each of the conductive layers and has from top view a long and slender perimeter form extending in one direction.

4. The nonvolatile semiconductor memory device according to claim 1,
   wherein the physical characteristic change layer comprises a resistance change layer having a resistance which changes in relation to the applied voltage or a charge storage layer storing electric charges.

5. The nonvolatile semiconductor memory device according to claim 1,
   wherein the columnar semiconductor layer has flexibility and includes an electrostatic layer, the electrostatic layer deforming the columnar semiconductor layer in the prescribed direction by applying electrostatic force to the columnar semiconductor layer via the first space.

6. The nonvolatile semiconductor memory device according to claim 4,
   wherein the physical characteristic change layer is the charge storage layer formed on a sidewall of the conductive layer, and each of the serially connected memory cells includes the charge storage layer formed on the sidewall of the conductive layer.

7. The nonvolatile semiconductor memory device according to claim 6, further comprising;
   a source-side selection transistor and a drain-side selection transistor connected to a lower end and an upper end of the memory cells, respectively.

8. The nonvolatile semiconductor memory device according to claim 7,
   wherein the conductive layer acts as a control gate electrode and a word line, the sidewall of the conductive layer contacting with the memory cell, and one end portion of each of the conductive layers is formed into a shape of stairs.

9. The nonvolatile semiconductor memory device according to claim 8, further comprising;
   a word line driving circuit connecting to the word line and controlling voltage applied to the word line;
   a source-side selection gate line driving circuit connecting to the source-side selection gate line and controlling voltage applied to the source-side selection gate line;
   a drain-side selection gate line driving circuit connecting to the drain-side selection gate line and controlling voltage applied to the drain-side selection gate line;
   a plurality of bit lines being connected to the memory strings; and
   a sense amplifier connecting to the bit line and amplifying voltage read out from the memory cells.

10. The nonvolatile semiconductor memory device according to claim 1, further comprising;
    a first actuator relatively moving the plurality of the conductive layer in a row direction for the columnar semiconductor layer; and a second actuator relatively moving the plurality of the conductive layer in a column direction for the columnar semiconductor layer.

11. The nonvolatile semiconductor memory device according to claim 10,
wherein the first actuator and the second actuator comprise at least one of electrostatic capacity-type elements, piezo-type elements and thermal expansion-type elements.

12. The nonvolatile semiconductor memory device according to claim 10, further comprising;
a memory cell region including the plurality of the memory cells;
a first conductive rectangular frame layer configured to surround the memory cell region;
a second conductive rectangular frame layer configured to surround the first frame layer;
a third conductive rectangular frame layer configured to surround the second frame layer;
a first connection layer formed in the column direction and electrically the first frame layer and the second frame layer;
a second connection layer being formed towards the row direction and electrically connected to the second frame layer and the third frame layer;
a second space being formed between the first frame layer and the second frame layer via a first insulation film and a second insulation film; and
a third space being formed between the second frame layer and the third frame layer via a third insulation film and a fourth insulation film;
wherein the first actuator comprises the first frame layer, the first insulation film, the second space, the second insulation film and the second frame layer, and the second actuator comprises the second frame layer, the third insulation film, the third space, the fourth insulation film and the third frame layer.

13. The nonvolatile semiconductor memory device according to claim 12,
wherein the first actuator and the second actuator are comb-like electrostatic capacity-type elements.

14. The nonvolatile semiconductor memory device according to claim 10,
wherein a relative distance is below 10 nm.

15. The nonvolatile semiconductor memory device according to claim 3,
wherein the parallel direction is the column direction.

16. The nonvolatile semiconductor memory device according to claim 4,
wherein the characteristic change layer comprises the resistance change layer, the resistance change layer being formed at a conductive layer side via a diode formed on the sidewall of the conductive layer and electrically being connected to the conductive layer.

17. The nonvolatile semiconductor memory device according to claim 5,
wherein the electrostatic layer is formed on the plurality of the conductive layer via a fifth insulation film, the columnar semiconductor layer is extended corresponding to the electrostatic layer to be formed as an electrostatic columnar semiconductor layer, the first space is extended to be configured between the electrostatic layer and the electrostatic columnar semiconductor layer, the electrostatic layer is formed to have a sidewall insulation layer on the sidewall thereof, the electrostatic layer includes a lower wiring layer and an upper wiring layer, the upper wiring layer being formed on the lower wiring layer and being sandwiched by a sixth insulation film, the lower wiring layer being formed as a stripe shape with a prescribed pitch to the row direction and extending to the column direction, the upper wiring layer being formed as a stripe shape with a prescribed pitch to the column direction and extending to the row direction.

18. The nonvolatile semiconductor memory device according to claim 5, further comprising;
a lower driving layer being formed between the conductive layer and the source-side selection transistor, the lower driving layer relatively moving the plurality of the conductive layer to the row direction corresponding to the columnar semiconductor layer by expanding and shrinking; and
an upper driving layer being formed between the drain-side selection transistor and the electrostatic layer, the upper driving layer relatively moving the plurality of the conductive layer to the row direction corresponding to the columnar semiconductor layer by expanding and shrinking.

19. The nonvolatile semiconductor memory device according to claim 18, wherein
the lower driving layer includes a lower portion first insulation layer, a lower portion first electrode layer, a piezo element film, a lower portion second electrode layer and a lower portion second insulation layer in order;
the upper driving layer an upper portion first insulation layer an upper portion first electrode layer, the piezo element film, an upper portion second electrode layer and an upper portion second insulation layer in order;
the columnar semiconductor layer is extended corresponding to the lower portion driving layer to be formed as a lower portion columnar semiconductor layer, the electrostatic columnar semiconductor layer is extended corresponding to the upper portion driving layer to be formed as a upper portion columnar semiconductor layer; and
the first space is extended to be configured between the lower portion driving layer and the upper portion driving layer, and between the lower portion columnar semiconductor layer and the upper portion columnar semiconductor layer.

20. The nonvolatile semiconductor memory device according to claim 1, further comprising;
an actuator configured to shift the conductive layers.

* * * * *